United States Patent [19]

Miyai et al.

[11] Patent Number: 5,581,324
[45] Date of Patent: Dec. 3, 1996

[54] THERMAL DISTORTION COMPENSATED PROJECTION EXPOSURE METHOD AND APPARATUS FOR MANUFACTURING SEMICONDUCTORS

[75] Inventors: Tsuneo Miyai, Tokyo; Yuji Imai, Ohmiya; Tetsuo Taniguchi, Yokohama; Kousuke Suzuki, Kawasaki, all of Japan

[73] Assignee: Nikon Corporation, Tokyo, Japan

[21] Appl. No.: 446,511

[22] Filed: May 22, 1995

Related U.S. Application Data

[63] Continuation of Ser. No. 254,780, Jun. 6, 1994, abandoned.

[30] Foreign Application Priority Data

Jun. 10, 1993 [JP] Japan .................................. 5-138488
Jun. 11, 1993 [JP] Japan .................................. 5-166504
Jul. 14, 1993 [JP] Japan .................................. 5-174162
Sep. 1, 1993 [JP] Japan .................................. 5-217675

[51] Int. Cl.$^6$ .......................... G03B 27/42; G03B 27/52
[52] U.S. Cl. .................................................. 355/53
[58] Field of Search ............................ 355/30, 53, 77

[56] References Cited

U.S. PATENT DOCUMENTS

| | | | |
|---|---|---|---|
| 4,503,335 | 3/1985 | Takahashi | 355/30 |
| 4,558,949 | 12/1985 | Uehara et al. | 356/152 |
| 4,564,284 | 1/1986 | Tsutsui | 355/30 |
| 4,624,551 | 11/1986 | Anzai et al. | 355/53 |
| 4,650,983 | 3/1987 | Suwa | 250/204 |
| 4,770,531 | 9/1988 | Tanaka et al. | 356/358 |
| 4,801,977 | 1/1989 | Ishizaka et al. | 355/30 |
| 5,105,075 | 4/1992 | Ohta et al. | 355/53 X |
| 5,117,255 | 5/1992 | Shiraishi et al. | 355/53 |
| 5,137,349 | 8/1992 | Taniguchi et al. | 355/53 X |
| 5,184,176 | 2/1993 | Unno et al. | 355/53 X |
| 5,217,834 | 6/1993 | Higaki | 430/30 |
| 5,270,771 | 12/1993 | Sato | 355/53 |

FOREIGN PATENT DOCUMENTS 4-192317  7/1992  Japan .

*Primary Examiner*—Fred L. Braun
*Attorney, Agent, or Firm*—Shapiro and Shapiro

[57] ABSTRACT

A projection exposure apparatus has a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state. The apparatus also includes a temperature measurement sensor for measuring a change in temperature of the mask, a control system for calculating the change amount of the imaging state caused by the change in temperature, and a correction system for correcting the change in imaging state.

24 Claims, 13 Drawing Sheets

THERMAL DISTORTION COMPENSATED PROJECTION EXPOSURE METHOD AND APPARATUS FOR MANUFACTURING SEMICONDUCTORS

This is a continuation of application Ser. No. 08/254,780 filed Jun. 6, 1994, now abandoned.

BACKGROUND OF THE INVENTION

1. Field of the Invention

The present invention relates to a projection exposure method and apparatus and, more particularly, to a projection exposure method and apparatus, which are used in the manufacture of a semiconductor element, a liquid crystal element, or the like in a photolithography process, and project a mask pattern onto a photosensitive substrate via a projection optical system.

2. Related Background Art

Conventionally, along with the miniaturization of patterns of semiconductor integrated circuits, a projection exposure apparatus must correct a change in imaging characteristics (e.g., a magnification, focal length, and the like) caused upon absorption of exposure light by a projection optical system. For example, as disclosed in U.S. Pat. No. 4,624,551 or U.S. Pat. No. 4,801,977, a projection exposure apparatus comprises a mechanism for correcting a variation of the optical characteristics of a projection optical system caused by illumination light absorption by detecting the amount of light incident on the projection optical system. This correction mechanism will be briefly described below. For example, a shutter OPEN signal during an exposure operation is received, the change amount of the optical characteristics is always calculated in accordance with a model, and the imaging characteristics are corrected to a predetermined value based on the change amount of the imaging characteristics by, e.g., moving at least one optical element constituting the projection optical system, or sealing a space sandwiched between two optical elements, and controlling the pressure in the sealed space.

In recent years, along with the miniaturization of patterns of semiconductor integrated circuits and the like, in a projection exposure apparatus, a change in imaging characteristics (e.g., the magnification, focal length, and the like of a projection optical system) caused by absorption of exposure illumination light by a reticle must be corrected. In view of this need, as disclosed in, e.g., Japanese Laid-Open Patent Application No. 4-192317, a mechanism for correcting the imaging state by detecting the thermal deformation amount of a reticle caused by absorption of illumination light has been proposed.

This mechanism will be briefly described below. The thermal deformation amount of a reticle caused by absorption of illumination light is numerically calculated on the basis of the heat absorbance of a reticle, the density distribution of a pattern, and the like, or is obtained by directly measuring the measurement mark position on the reticle. Based on the obtained thermal deformation amount, a change in imaging state of the projection optical system is predicted by an actual measurement or calculation. Then, correction is performed to make the imaging state constant or to minimize the influence of the variation of the imaging state on the basis of the prediction result using a correction means of the imaging state.

In the above-mentioned techniques, a problem associated with absorption of exposure light by the projection optical system is solved for the present. However, since exposure light rays are also transmitted through a mask, the mask thermally deforms due to absorption of exposure light, and the imaging characteristics change due to the thermal deformation of the mask.

In particular, since a pattern is drawn on the mask using, e.g., chromium, a chromium portion considerably absorbs heat unlike a glass portion having a high transmittance. Furthermore, in recent years, in order to prevent flare of an optical system, a technique for lowering the reflectance of a chromium portion on the mask tends to be adopted. With this technique, heat absorption by the chromium portion is promoted.

Upon heat absorption by the chromium portion, the temperature of the glass portion of the mask also increases, and the entire mark may thermally expand. According to an actual measurement, an increase in temperature of the mask is about 5° C. under the worst condition. Since the material of the mask is generally quartz glass, and its expansion coefficient is 0.4 ppm/° C., the temperature rise of about 5° C. causes a deviation of 0.02 µm with respect to a 10 mm interval, and causes a distortion error or magnification error on the image plane.

The chromium pattern on the mask is not always uniformly distributed on the entire surface of the mask, and its distribution state is locally uneven. In this case, the temperature of the mask locally increases, and an anisotropic distortion may be generated. Also, when only a portion of the mask is exposed using a light-shielding band (variable field stop), an anisotropic distortion may be similarly generated. Such a distortion of the mask causes an anisotropic distortion in an image to be projected. In this case, the distortion cannot be sufficiently removed by correcting only magnification components.

As described above, when the mask thermally deforms, the imaging characteristics deviate from normal characteristics depending on the type of mask used in the conventional technique. More specifically, when another type of mask is used, since it generally has different thermal deformation characteristics, the imaging characteristics cannot be sufficiently corrected. When exposure is performed by sequentially exchanging masks, since the conventional technique does not consider thermal deformation characteristics of each of these masks, large errors are generated.

As a countermeasure against this problem, for example, a mask may be cooled to a predetermined temperature. However, since the glass surface temperature and the temperature of the chromium portion of the mask cannot be set constant, it is impossible to cool the entire mask to have a uniform thermal distribution. Since cooling is a phenomenon accompanying heat conduction and has poor response characteristics, it cannot quickly follow OPEN and CLOSE requests of a shutter.

Also, it is difficult to accurately measure the ratio of pattern existence on a reticle under the influence of the pattern shape on the pattern surface of the reticle, the material (chromium or the like) forming the pattern, and the like.

In a reticle with a small pattern (with the low ratio of pattern existence), since the reticle undergoes almost no expansion by heat absorption of illumination light, the considerable portion of the overall error is accounted for by error components caused by correction itself, and final imaging characteristics may be worsened as compared to those before correction.

These points which have not posed serious problems in terms of accuracy in the conventional apparatus are expected to be of extreme importance for projection patterns, which are miniaturized more and more in recent years and will be miniaturized more and more in future.

SUMMARY OF THE INVENTION

The present invention has been made in consideration of the above-mentioned situation, and has as an object to satisfactorily correct a change in imaging state caused by the thermal deformation of a mask.

In order to achieve the above object, according to a first invention, there is provided a projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a temperature measurement sensor for measuring a change in temperature of the mask;

a control system for calculating a change amount of the imaging state caused by the change in temperature; and a correction system for correcting the change in imaging state.

According to a second invention, there is provided a projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a deformation amount measurement system for measuring a physical quantity corresponding to a deformation amount of the mask;

an imaging state calculation system for estimating a change amount of the imaging state caused by the deformation amount of the mask on the basis of a measurement result of the deformation amount measurement system;

a correction system for correcting the change in imaging state; and a control system for, when the change amount of the imaging state estimated by the imaging state calculation system is larger than an error amount, from a target imaging state, of an image state obtained when the imaging state is changed by operating the correction system, operating the correction system to change the imaging state so as to cancel the change amount of the imaging state estimated by the imaging state calculation system.

According to a third invention, there is provided a projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a deformation amount measurement system for measuring a physical quantity corresponding to a deformation amount of the mask;

an imaging state calculation system for estimating a change amount of the imaging state on the photosensitive substrate caused by the deformation amount of the mask on the basis of a measurement result of the deformation amount measurement system;

a correction system for changing the imaging state; and a control system for, when the change amount of the imaging state estimated by the imaging state calculation system is larger than an error amount of the change amount of the imaging state estimated by the imaging state calculation system, operating the correction system to change the imaging state so as to cancel the change amount of the imaging state estimated by the imaging state calculation system.

According to a fourth invention, there is provided a projection exposure method for imaging an image of a pattern formed on a mask onto a photosensitive substrate in a predetermined imaging state using a projection exposure apparatus which comprises a light source for emitting illumination light, an illumination optical system for illuminating a mask, on which a predetermined pattern is formed, with the illumination light, and a projection optical system for forming an image of the pattern on the photosensitive substrate, comprising the steps of:

measuring a physical quantity corresponding to a deformation amount of the mask using a deformation amount measurement system;

estimating, using an imaging state calculation means, a change amount of the imaging state caused by the deformation amount of the mask on the basis of a measurement result of the deformation amount measurement system;

correcting the change in imaging state using a correction system; and operating the correction system to change the imaging state so as to cancel the change amount of the imaging state estimated by the imaging state calculation system, when the change amount of the imaging state estimated by the imaging state calculation system is larger than an error amount, from a target imaging state, of an image state obtained when the imaging state is changed by operating the correction system.

According to a fifth invention, there is provided a projection exposure method for imaging an image of a pattern formed on a mask onto a photosensitive substrate in a predetermined imaging state using a projection exposure apparatus which comprises a light source for emitting illumination light, an illumination optical system for illuminating a mask, on which a predetermined pattern is formed, with the illumination light, and a projection optical system for forming an image of the pattern on the photosensitive substrate, comprising the steps of:

measuring a physical quantity corresponding to a deformation amount of the mask using a deformation amount measurement system;

estimating, using an imaging state calculation system, a change amount of the imaging state on the photosensitive substrate caused by the deformation amount of the mask on the basis of a measurement result of the deformation amount measurement system;

changing the imaging state using a correction system; and operating the correction system to change the imaging state so as to cancel the change amount of the imaging state estimated by the imaging state calculation system, when the change amount of the imaging state estimated by the imaging state calculation system is larger than an error amount of the change amount of the imaging state estimated by the imaging state calculation system.

When the mask chucking force of a holding member for holding a mask varies or when foreign matter or the like is present on a portion to be checked of a mask, the mask shifts or rotates in the X-Y plane in correspondence with thermal deformation. As a result, even when a change in imaging characteristics caused by thermal deformation of the mask can be corrected, the pattern area on the mask is imaged on the shot area on a wafer with a position or rotation shift.

It is another object of the present invention to satisfactorily maintain the imaging state of a pattern on a mask good all the time by correcting a position shift of the mask in a reference or fiducial plane.

In order to achieve the above object, according to a sixth invention, there is provided an exposure method for transferring a pattern on a mask onto a photosensitive substrate by radiating illumination light in a predetermined wavelength range onto a pattern area of the mask held in a predetermined reference plane, comprising the steps of:

calculating a thermal deformation amount of the pattern area when the pattern area thermally deforms upon absorption of the illumination light while a position, in the reference plane, of a predetermined reference point in the pattern area is fixed;

determining movable ranges upon the thermal deformation, in the reference plane, of a plurality of predetermined points in the pattern area on the basis of the thermal deformation amount calculated in the calculating step, and calculating a maximum value of a deviation amount obtained when the pattern area thermally deformed by the amount calculated in the calculating step is deviated in a direction of the reference plane, so that the plurality of points in the pattern area thermally deformed by the amount calculated in the calculating step respectively exist in the movable ranges; and determining based on a value of the deviation amount if a position, in the reference plane, of the mask is detected.

In recent years, along with the miniaturization of patterns of semiconductor integrated circuits and the like, in order to prevent a decrease in yield caused by foreign matter (very small dust particles in air or the like) attached to a pattern on a mask, a protective film (so-called pellicle) extends or cover glass is arranged, via a rectangular frame (pellicle frame), on at least one of the pattern formation surface of a mask and a glass surface, thereby preventing foreign matter from directly becoming attached to a circuit pattern. The pellicle or the like forms an air chamber sealed by the mask, pellicle, and pellicle frame. For this reason, when the temperature of the mask increases due to absorption of exposure light, air in the sealed air chamber serves as a heat insulating member, and prevents heat from being conducted from the mask to an external portion. In other words, the temperature rise of the mask becomes large. For this reason, even if the same mask is used, the thermal deformation state of the mask varies depending on the presence/absence of the pellicle or the like, and hence, the change amount of the imaging characteristics varies. The pellicle or the like not only provides the above-mentioned heat insulation effect but also increases the deformation of the mask due to thermal expansion of the pellicle frame (e.g., a metal frame).

It is still another object of the present invention to maintain a predetermined imaging state independently of the presence/absence of a pellicle or the like.

In order to achieve the above object, according to a seventh invention, there is provided a projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a data input system for inputting shape data representing a shape of the mask;

a calculation system for calculating a change amount of the predetermined imaging state caused in correspondence with a deformation amount of the mask on the basis of the shape data input from the data input system; and a correction system for correcting the imaging state so as to cancel the change amount calculated by the calculation system.

DESCRIPTION OF THE PREFERRED EMBODIMENTS

Figure 1:
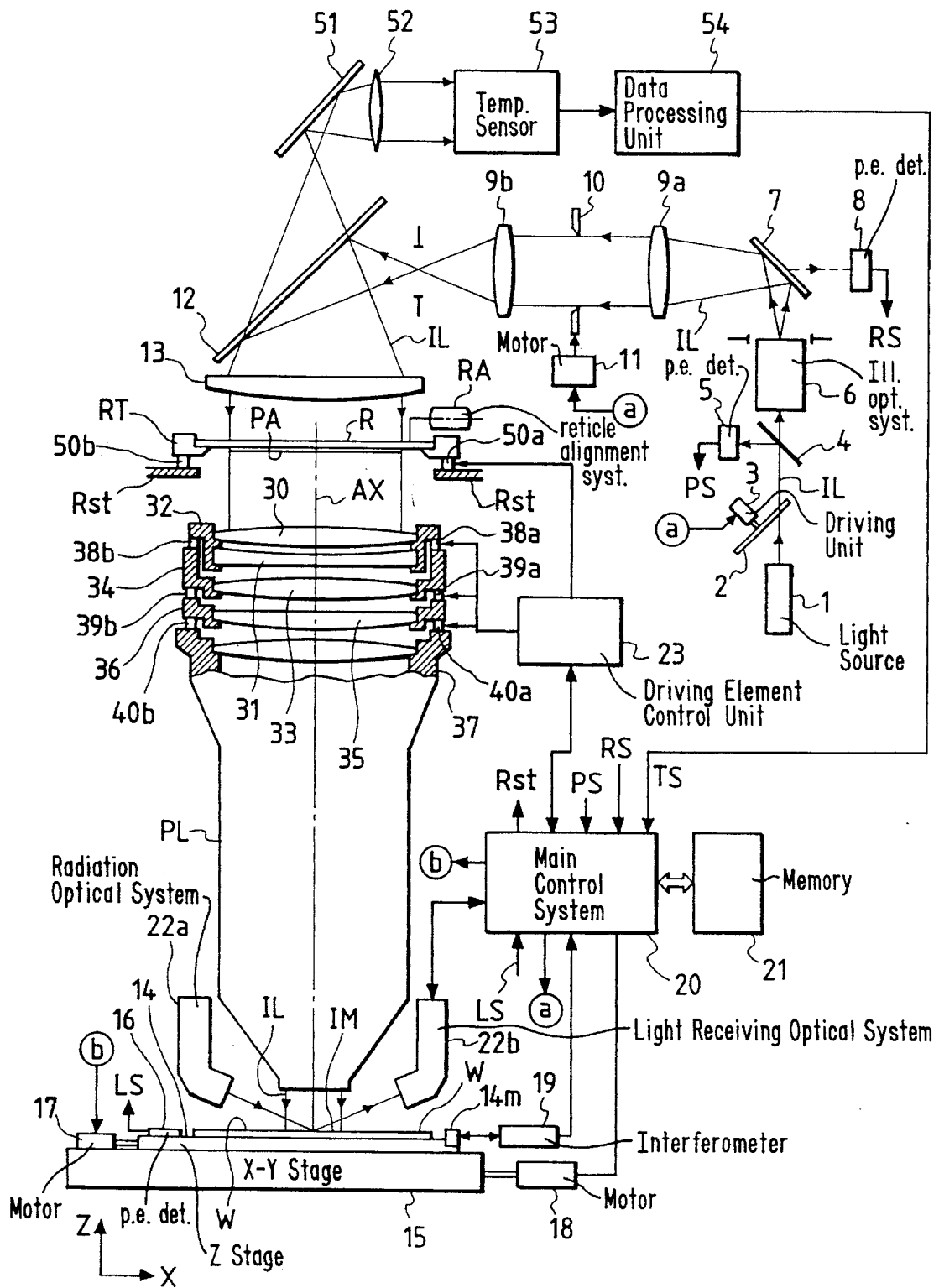
FIG. 1 is a schematic view showing the arrangement of a projection exposure apparatus according to a first embodiment of the present invention.

FIG. 1 is a schematic view showing the arrangement of a projection exposure apparatus according to the first embodiment of the present invention.

Referring to FIG. 1, an exposure illumination light source 1 such as an ultra-high-pressure mercury lamp, an excimer laser source, or the like generates illumination light IL such as g-lines, i-lines, or ultraviolet pulse light (e.g., KrF excimer laser or the like), having a wavelength (exposure wavelength) which can expose a resist layer. The illumination light IL passes through a shutter 2 for closing/opening the optical path of the illumination light, and a half mirror 4 which transmits most of (more than 90% of) illumination light. Thereafter, the illumination light IL reaches an illumination optical system 6 including an optical integrator (fly-eye lens), and the like.

The shutter 2 is driven by a driving unit 3 to control passage and shielding of illumination light. Some light components of the illumination light reflected by the half mirror 4 are incident on a photoelectric detector (power monitor) 5 comprising, e.g., a PIN photodiode. The power monitor 5 photoelectrically detects the illumination light IL, and outputs optical information (intensity value) PS to a main control system 20. The information PS is used as fundamental data in the main control system 20 so as to obtain a variation amount of imaging characteristics caused by exposure light absorption by a projection optical system PL.

The illumination light IL is processed by the illumination optical system 6 to equalize its beam and to eliminate speckles therefrom, and is reflected by a beam splitter 7 having a high reflectance via an aperture stop. The illumination light IL then passes through a relay lens 9a, a variable blind 10, and a relay lens 9b, and thereafter, is reflected by a dichroic mirror 12 in the vertical direction (Z-direction) in FIG. 1. The illumination light IL then reaches a main condenser lens 13. The illumination light IL reflected by the dichroic mirror 12 is condensed by the main condenser lens 13, and illuminates a pattern area PA on a reticle R with a uniform illuminance. Since the arranging plane of the variable blind 10 has an imaging relationship with the pattern area PA on the reticle R, movable blades constituting the variable blind 10 are opened/closed by a driving motor 11 to change the position and pattern of an aperture, thereby arbitrarily selecting the illumination field of the reticle R.

In this embodiment, the dichroic mirror is obliquely arranged above the reticle R at an angle of 45°. The dichroic mirror 12 has a reflectance of 90% or more with respect to light in a short-wavelength range (the ultraviolet range including an exposure wavelength), and a transmittance of 50% or more with respect to light in a long-wavelength range (the infrared range longer than the exposure wavelength).

In the arrangement of this embodiment, light reflected by a wafer W upon illumination of the illumination light IL reaches the beam splitter 7 via the projection optical system PL and the reticle R, and light transmitted through the beam splitter 7 is incident on a photodetector (reflection amount monitor) 8. The reflection amount monitor 8 outputs light information (intensity value) RS obtained by photoelectrically detecting the light reflected by the wafer W to the main control system 20. The information RS is used in the main control system 20 as fundamental data for obtaining a variation amount of imaging characteristics caused by absorption of exposure light by the projection optical system PL.

Furthermore, in this embodiment, by receiving infrared rays generated by the reticle R, a change in temperature (the temperature distribution) of the reticle R caused by absorption of the illumination light IL is measured. Infrared rays generated by the reticle R are transmitted through the dichroic mirror 12, and are then reflected by a mirror 51 in the horizontal direction in FIG. 1. Then, the reflected infrared rays are incident on a temperature sensor 53 via a lens 52.

When the temperature sensor 53 comprises, e.g., an infrared ray camera, the temperature distribution of the reticle R can be easily detected. In place of the infrared ray camera, the temperature sensor 53 may comprise a two-dimensional arrangement of a plurality of photoelectric sensors (Si, Ge, PbS, CdS, or the like) having sensitivity to infrared rays so as to detect temperature.

Upon reception of temperature data detected by the temperature sensor 53, a temperature data processing unit 54 calculates the temperature distribution of the reticle R. The calculated temperature distribution information TS is output to the main control system 20, and is used in the main control system 20 as fundamental data for calculating the variation amount of imaging characteristics caused by absorption of exposure light by the reticle R.

In this manner, since the dichroic mirror 12 is arranged above the reticle R to guide infrared rays generated from the reticle R to the temperature sensor 53, the temperature distribution in the reticle R can always be obtained with high accuracy without disturbing a projection exposure process (i.e., even in exposure) according to temperature measurement means of the present invention.

The reticle R is placed on a reticle stage Rst which is two-dimensionally movable within the horizontal plane (X-Y plane), and is held by a reticle table RT which is vertically movable via driving elements 50a, 50b, and 50c, which are capable of expansion and contraction. The reticle R is aligned, so that the central point of the pattern area PA coincides with the optical axis AX. The reticle R is initially set by finely moving the reticle stage Rst on the basis of a mark detection signal from a reticle alignment system RA for photoelectrically detecting alignment marks (see FIG. 13) arranged on the peripheral portion of the reticle. The reticle R to be used is properly exchanged by a reticle exchanger (not shown). In particular, when a large number of types of products are produced in small quantities, reticles are exchanged frequently.

The illumination light IL transmitted through the pattern area PA is incident on the double-side telecentric projection optical system PL. The projection optical system PL projects (images) an image of the circuit pattern on the reticle R on one of shot areas on the wafer W, on the surface of which a resist layer is formed, and which is held, so that its surface almost coincides with an imaging plane IM. The wafer W is placed on a Z stage 14, which is finely movable by a driving motor 17 in the optical axis direction (Z-direction).

Furthermore, the Z-stage 14 is placed on an X-Y stage 15 which is two-dimensionally movable by a step-and-repeat method by a driving motor 18. The X-Y stage 15 is stepped to the next shot position upon completion of transfer exposure of the reticle R on one shot area on the wafer W.

The two-dimensional position of the X-Y stage 15 is always detected by an interferometer 19 at a resolution of, e.g., about 0.01 μm, and a movable mirror 14m for reflecting a laser beam from the interferometer 19 is fixed to the end portion of the Z stage 14. A photoelectric detector (radiation amount monitor) 16, which has a light-receiving surface having substantially the same area as that of the projected area of the reticle pattern or the image field of the projection optical system PL, is arranged on the Z stage 14, so as to substantially coincide with the surface position of the wafer W, and information LS associated with the radiation amount is also supplied to the main control system 20. The information LS is used in the main control system 20 as fundamental data for obtaining the variation amount of imaging characteristics caused by absorption of exposure light by the projection optical system PL.

Also, referring to FIG. 1, an oblique light incidence type surface detection system is constituted by a radiation optical system 22a for supplying an imaging light beam or collimated light beam for forming an image of a pin hole or slit toward the imaging plane IM of the projection optical system PL from an oblique direction with respect to an optical axis AX, and a light-receiving optical system 22b for receiving a light beam obtained upon reflection of the imaging or collimated light beam by the wafer surface.

The arrangement and the like of the surface detection system (22a, 22b) are disclosed in, e.g., U.S. Pat. No. 4,558,949 and U.S. Pat. No. 4,650,983, and is constituted by combining a focus detection system for detecting the position, in the vertical direction (Z-direction) of the wafer surface with respect to the imaging plane IM, and detecting a focusing state between the wafer W and the projection optical system PL, and a horizontal position detection system for detecting the inclination of a predetermined area on the wafer W with respect to the imaging plane IM.

In this embodiment, the angle of a plane-parallel glass (not shown) arranged inside the light-receiving optical system 22b is adjusted, so that the imaging plane IM serves as a zero-point reference, thereby calibrating the focus detection system. In addition, when the surface of the wafer W coincides with the imaging plane IM, the horizontal position detection system is calibrated, so that a collimated light beam from the illumination optical system 22a is focused at the central position of a four-split light-receiving element (not shown) in the light-receiving optical system 22b.

The arrangement of a correction means for correcting an imaging state will be explained below. In this embodiment, as will be described in detail later, the imaging characteristics (the projection magnification, distortion, and the like) are corrected by driving lens elements of the projection optical system PL. In order to allow adjustment of the optical characteristics of the projection optical system PL, some optical elements of the optical system PL are movable.

As shown in FIG. 1, lens elements (30, 31) of a first group closest to the reticle R are stationarily supported by a support member 32, a lens element 33 of a second group is stationarily supported by a support member 34, and a lens element 35 of a third group is stationarily supported by a support member 36. In addition, lens elements below the lens element 35 (in FIG. 1) are stationarily supported by a lens barrel portion 37 of the projection optical system PL.

Note that the optical axis AX of the projection optical system PL of this embodiment indicates the optical axis of the lens elements fixed to the lens barrel portion 37. The support member 36 is coupled to the lens barrel portion 37 of the projection optical system PL via driving elements 40a, 40b, and 40c, which are capable of expansion and contraction. The support member 34 is coupled to the support member 36 via driving elements 39a, 39b, and 39c, which are capable of expansion and contraction, and the support member 32 is coupled to the support member 34 via driving elements 38a, 38b, and 38c, which are capable of expansion and contraction.

In this embodiment, the lens elements (30, 31), (33), and (35) close to the reticle R are movable by a driving element control unit 23, and as these lens elements, ones which have a larger influence on magnification and distortion characteristics than other lens elements and can be easily controlled are selected.

Since this embodiment adopts the three groups of movable lens elements, the movable range of the lens element can be widened while suppressing variations of various other aberrations. In addition, these lens elements can cope with various shapes of distortions (e.g., a trapezoidal distortion, rhombic distortion, barrel distortion, pin-cushion distortion, and the like), and can satisfactorily correct a variation of the imaging characteristics of the projection optical system PL caused by thermal deformation of the reticle R upon absorption of exposure light. Note that the lens elements are moved within a range in which the influence on other various other aberrations (e.g., an astigmatism) of the projection optical system PL can be ignored. Alternatively, by adjusting the interval between two adjacent lens elements, various other aberrations may be corrected while controlling the magnification and distortion characteristics.

Figure 2:
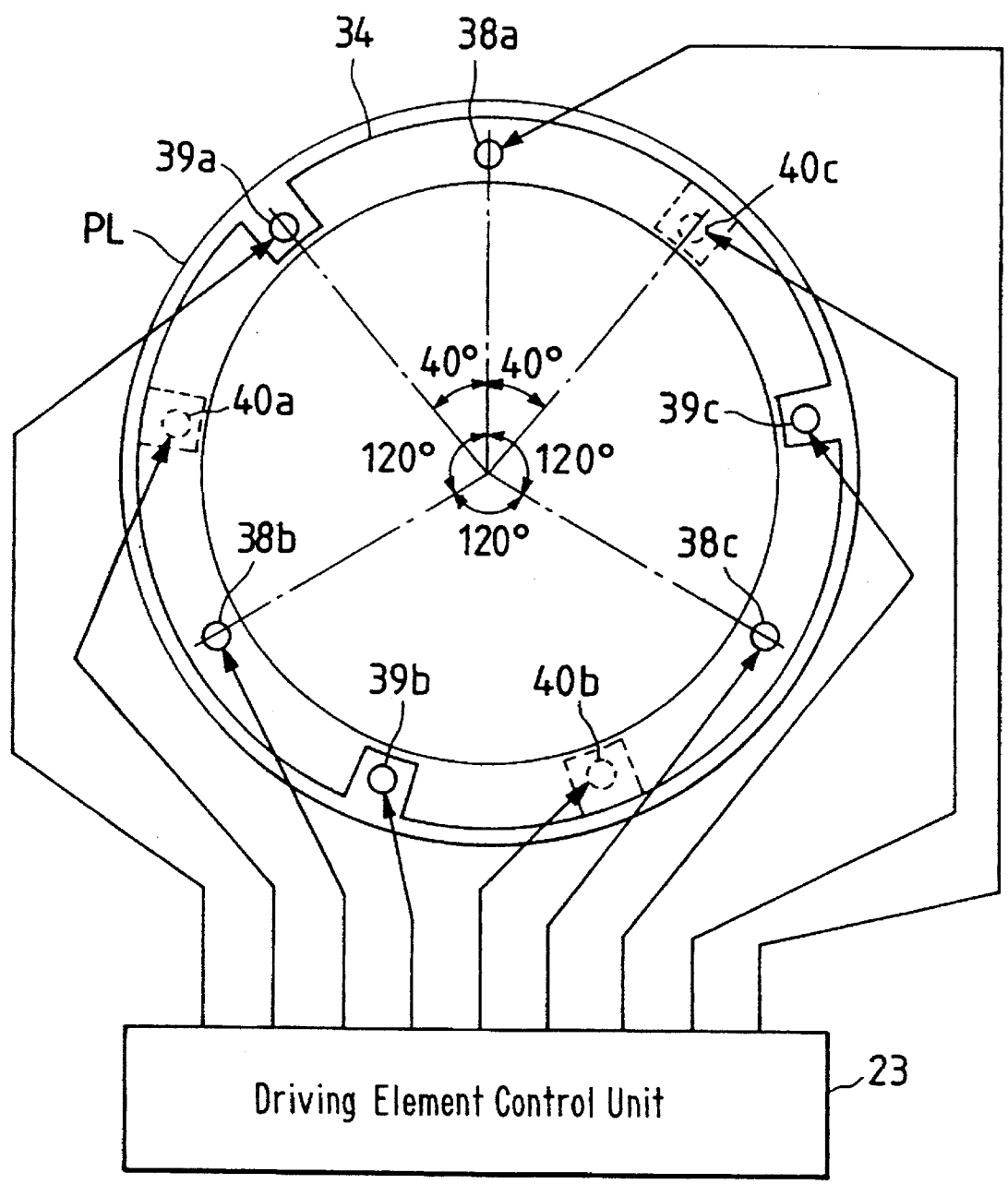
FIG. 2 is a plan view showing a projection optical system shown in FIG. 1 when viewed from the above.

FIG. 2 is a plan view showing the projection optical system when viewed from the above (reticle side). The driving elements 38a to 38c are arranged at positions separated by 120°-angular intervals, and can be independently controlled by the driving element control unit 23. Similarly, the driving elements 39a to 39c and 40a to 40c are arranged at positions separated by 120°-angular intervals, and can be independently controlled by the driving element control unit 23. The driving elements 38a, 39a, and 40a are arranged at positions shifted by 40°-angular intervals, and the driving elements 38b, 39b, and 40b, and the driving elements 38c, 39c, and 40c are similarly arranged at positions separated by 40°-angular intervals.

Note that the above-mentioned driving elements 50a to 50c are arranged in the same manner as the driving elements 38a to 40c, and can be independently controlled by the driving element control unit 23.

The driving elements 38a to 38c, 39a to 39c, 40a to 40c, and 50a to 50c comprise, e.g., electrostrictive elements, magnetostrictive elements, or the like, and the displacement amount of each driving element in correspondence with the voltage or magnetic field to be applied to the driving element is obtained in advance. Although not shown, in consideration of the hysteresis characteristics of each driving element, a capacitive type position sensor, a differential transformer, and the like as a position detection device are arranged near the driving element. Therefore, since the position of each driving element corresponding to the voltage or magnetic field to be applied to the driving element can be monitored, driving control can be achieved with high accuracy.

With the above arrangement, three points around each of the three groups of lens elements (30, 31), (33), and (35) can be independently moved in the direction of the optical axis AX of the projection optical system PL by an amount corresponding to a driving command supplied from the main control system 20. As a result, each of the three groups of lens elements (30, 31), (33), and (35) can be translated almost along the optical axis AX, and can be inclined at an arbitrary angle with respect to a plane perpendicular to the optical axis AX. Note that the lens elements are inclined to have the optical axis AX as an imaginary inclination reference.

Also, the reticle R can be moved via the driving elements 50a to 50c, as needed.

The main control system 20 obtains the information PS, the information RS, and the information LS from the power monitor 5, the reflection amount monitor 8, and the radiation amount monitor 16, and calculates the variation amount of the imaging characteristics caused by absorption of exposure light by the projection optical system according to the prior art. Also, the main control system 20 receives the temperature distribution information TS of the reticle R from the temperature data processing unit 54, and calculates the variation amount of the imaging characteristics caused by absorption of exposure light by the reticle R according to the present invention, as will be described later. Furthermore, the main control system 20 systematically controls the overall apparatus such as the driving element control unit 23.

A memory 21 stores formulas, tables or the like for calculating the thermal deformation amount of the mask and hence the change amount of the imaging state on the basis of the measured temperature distribution.

The method of calculating the variation amount of the imaging characteristics will be described below. The present invention particularly pays attention to a variation of the imaging characteristics caused by thermal deformation of the reticle R, and corrects it. Upon calculation of the variation amount of the imaging characteristics, the thermal deformation amount of the reticle R must be calculated first.

Since it can be considered that the reticle R thermally deforms in proportion to the temperature distribution of the reticle R, the temperature distribution of the reticle R at a certain time need only be detected so as to calculate the thermal deformation amount. According to the present invention, the above-mentioned temperature measurement means can accurately measure the temperature distribution without disturbing the projection exposure process.

Figure 3:
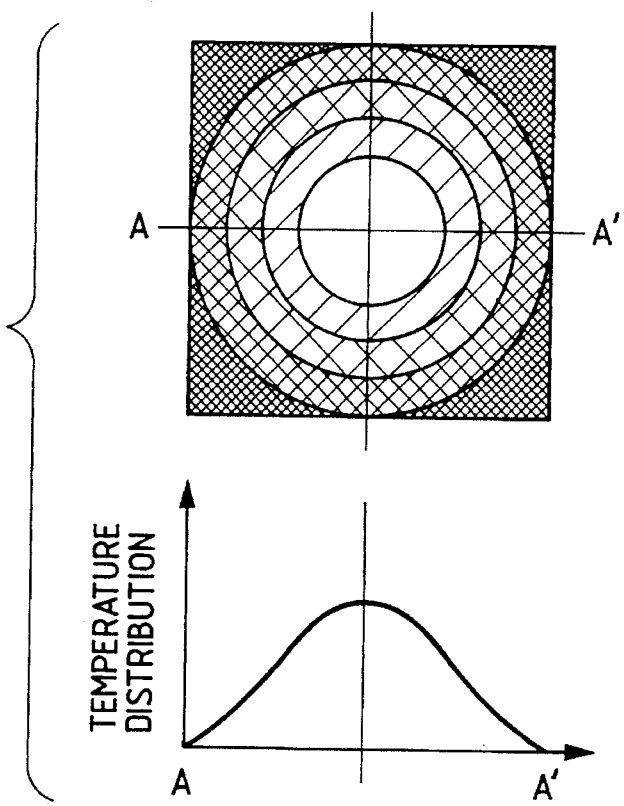
FIG. 3 is a graph showing a temperature distribution symmetrical about an optical axis.
Figure 4:
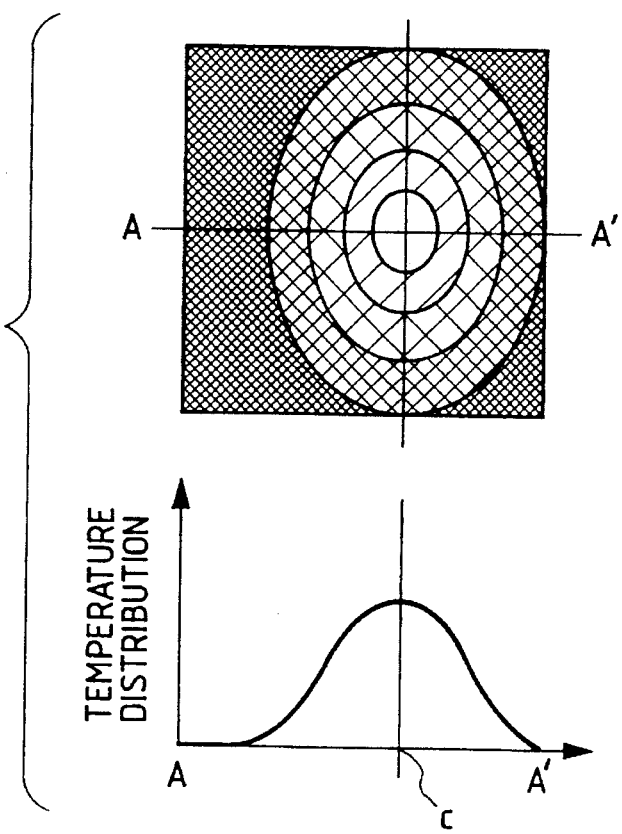
FIG. 4 is a graph showing a temperature distribution asymmetrical about the optical axis.

FIGS. 3 and 4 show typical temperature distributions of the reticle R taken by, e.g., an infrared ray camera. FIG. 3 shows a temperature distribution symmetrical about the optical axis, and FIG. 4 shows a temperature distribution asymmetrical about the optical axis. During projection exposure, the illumination light IL is uniformly radiated onto the reticle R, and in this case, the temperature distribution changes depending on, e.g., the arrangement of a chromium portion forming the pattern, as has been described above.

As shown in FIG. 3, when the temperature distribution of the reticle R is symmetrical about the optical axis, i.e., is isotropic, the reticle isotropically deforms as a whole as well. As a result, a change in magnification is dominant on the image plane. On the other hand, as shown in FIG. 4, when the temperature distribution of the reticle R is asymmetrical about the optical axis, i.e., is anisotropic, the reticle anisotropically deforms as a whole as well. As a result, a change in distortion is dominant on the image plane.

In general, the deformation of the reticle can be strictly calculated from the temperature distribution by a calculation based on, e.g., a finite element method, and furthermore, the change amount of the imaging state can be obtained by an optical calculation or actual measurement. However, as a simpler method, the relationship between the temperature average value (or temperature peak value), the temperature peak position (or temperature distribution barycentric position), and the like of each of some typical temperature distribution patterns, and the change amount of the magnification and the change amount of the distortion may be calculated in advance, and in actual projection exposure, the corresponding change amount of the magnification or change amount of the distortion may be directly calculated in accordance with the average temperature (or peak temperature), the temperature peak position (or temperature distribution barycentric position), and the like.

With either of the above-mentioned methods, the change amount of the imaging characteristics of the projection optical system (i.e., the deformation amount of a projected image) corresponding to thermal deformation of the reticle R is calculated from the obtained temperature distribution, and magnification change components and distortion change components are separately calculated from the calculated change amount of the imaging characteristics.

A method of correcting the imaging state will be described below. Basically, as described above, a desired imaging state is obtained by driving the three groups of lens elements (30, 31), (33), and (35) of the projection optical system PL, or the reticle R in the optical axis direction or in an oblique direction to have an axis perpendicular to the optical axis as a rotational axis. In this case, the following description will be given for only correction of a change in magnification and a change in distortion. However, the method of this embodiment can also correct the curvature of field, and the like. For example, the change in magnification and the change in distortion upon driving of the lens elements (30, 31) will be described below with reference to FIGS. 5 and 6.

Figure 5:
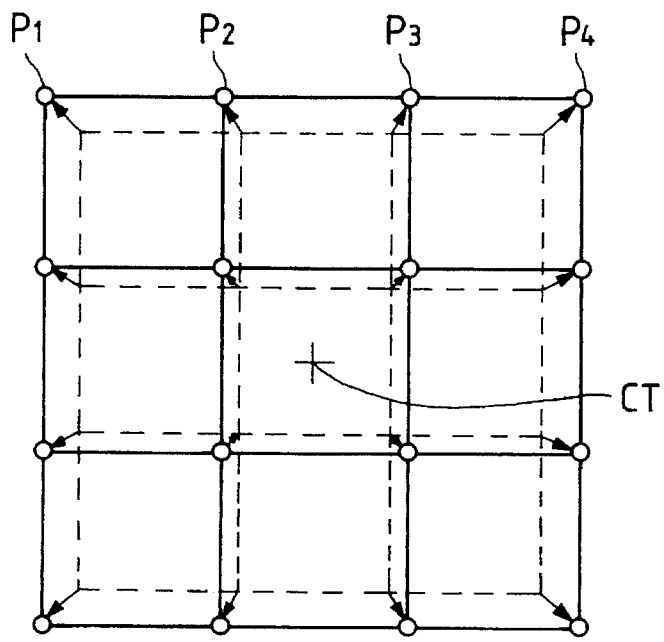
FIG. 5 is a view showing movement of a point in an image plane by a magnification correction means according to the first embodiment of the present invention.
Figure 6:
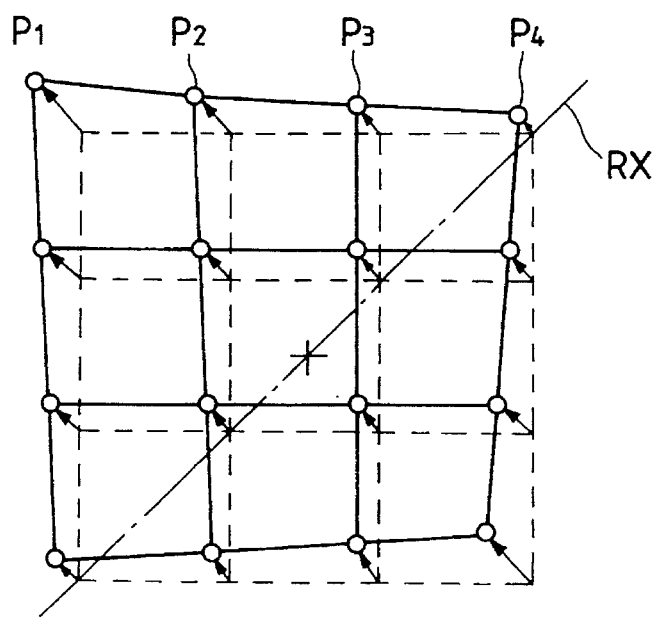
FIG. 6 is a view showing movement of a point in the image plane by a distortion correction means according to the first embodiment of the present invention.

In FIGS. 5 and 6, a dotted line represents the image plane free from thermal deformation of the reticle, and a solid line represents a state wherein the image plane is deformed by thermal deformation. In order to clearly show the deformation, the method of this embodiment considers lattice points. In practice, however, since the way of change varies depending on the arrangement of lens elements, FIGS. 5 and 6 are merely examples and are not general cases.

When the lens elements (30, 31) are moved in the optical axis direction, the magnification changes to have the optical axis as a center CT. FIG. 5 shows a state of the change in magnification. When the lens elements (30, 31) are inclined to have an axis perpendicular to the optical axis as the center, the distortion changes, as shown in, e.g., FIG. 6. In this example, an image portion separated from a rotational axis RX changes in the direction perpendicular to the rotational axis RX.

As described above, various changes in magnification or changes in distortion can be corrected by combining the driving methods of the lens element groups (30, 31), (33), and (35). Also, by vertically moving or inclining the reticle R, the distortion (especially, a pin-cushion or barrel distortion) can be changed. Upon driving the lens elements (or the reticle) to correct a change in magnification or change in distortion, other aberrations (e.g., coma, astigmatism, and the like) may deteriorate. However, since a plurality of lens elements can be driven, desired magnification or distortion correction can be achieved while correcting various aberrations.

The memory 21 stores, in the form of formulas or tables, movements of a plurality of points (lattice points) on the image plane upon driving of the lens elements or the reticle, as shown in FIGS. 5 and 6. The main control system 20 calculates an optimal magnification or distortion correction amount in correspondence with the change amount of the imaging characteristics of the projection optical system PL caused by thermal deformation of the reticle R. As a calculation method, for example, magnification or distortion correction which satisfies a condition for minimizing the maximum value of deviations from ideal lattice points, i.e., lattice points (indicated by dotted lines in FIGS. 5 and 6) obtained when the reticle R is in a cool state, or a condition for minimizing the square sum of deviations may be used.

The magnification and distortion correction means of this embodiment have been described. In this embodiment, upon driving of the lens element groups (30, 31), (33), and (35), the image plane may change (may vertically move or be inclined). In this case, when an offset is given to the wafer surface detection system (22a, 22b) in correspondence with the change in image plane, the wafer W can always be set to coincide with the best image plane, and the influence of the change in image plane can be prevented.

The wafer surface detection system (22a, 22b) radiates light rays onto the wafer surface, and detects the position, in the optical axis direction, or inclination of the wafer surface on the basis of light reflected by the wafer surface, as described above. The main control system 20 controls the Z stage 14 in correspondence with the output from the wafer surface detection system (22a, 22b), and the Z stage is driven, so that the wafer W always coincides with the image plane.

As another means for correcting the imaging state, a method of moving the reticle R in the optical axis direction, inclining reticle R, or curving the reticle R, a method of arranging a sealed space between two adjacent lens elements in the projection optical system, and adjusting the pressure in the sealed space, a method of arranging a plane-parallel glass above or below the projection optical system, and flexing the glass by controlling the interior of the glass, and the like are available.

In general, in order to correct a so-called anisotropic distortion such as a change in distortion, which is not symmetrical about the optical axis, the method of moving the reticle R along the optical axis AX using the driving elements 50a to 50c, or the method of driving the lens elements according to this embodiment is preferable.

As described above, in the projection exposure apparatus of the present invention, the memory 21 pre-stores parameters for calculating thermal deformation of the reticle R on the basis of the temperature distribution, and the variation amount of the imaging state, in the manufacture of the apparatus. During an exposure operation, the power monitor 5, the reflection amount monitor 8, and the radiation amount monitor 16 output optical information (intensity values) to the main control system 20, and the temperature data processing unit 54 outputs the temperature distribution information of the reticle to the main control system 20.

The main control system 20 calculates a change in imaging state caused by absorption of exposure light by the reticle R and a change in imaging state caused by absorption of exposure light by the projection optical system PL on the basis of these pieces of information, and data stored in the memory 21 described above, and calculates a total change amount.

When the imaging state of the projection optical system PL is also changed by other factors such as a change in atmospheric pressure, the change amounts caused by these factors can also be totaled as needed. An optimal correction amount is calculated in correspondence with the total value of the change amounts of the imaging state, and the lens element driving elements 38a to 38c, 39a to 39c, and 40a to 40c are driven to perform correction. In this case, another correction means, e.g., the driving elements 50a to 50c may be driven to perform correction, as needed.

As for inclinations of the focal point position and the image plane, the wafer W is vertically moved and inclined using the wafer surface detection system (22a, 22b) and the Z stage 14, so that the best imaging plane of the projection optical system PL can coincide with the wafer surface.

As described above, according to this embodiment, the temperature sensor 53 can time-serially obtain the temperature distribution of the reticle R caused by absorption of illumination light with high accuracy, and the thermal deformation amount of the reticle R can be accurately calculated on the basis of the temperature distribution. Furthermore, a change in imaging state can be calculated by optical calculations or formulas based on actual measurement on the basis of the calculated thermal deformation amount of the reticle R.

A change in imaging state can be roughly classified into a change in magnification corresponding to an isotropic deformation of the reticle R and a change in distortion corresponding to an anisotropic deformation of the mask. Therefore, by properly controlling at least one of the magnification and distortion correction means as correction means for the imaging characteristics, correction can be achieved to obtain the best imaging state.

As described above, according to this embodiment, since variation components of the imaging characteristics caused by thermal deformation of the reticle R are canceled and corrected by the means for correcting the imaging characteristics, the best imaging state can always be maintained irrespective of the type of reticle R to be used.

The second embodiment of the present invention will be described below.

The same reference numerals in the second embodiment denote the same parts as in the first embodiment, and a detailed description thereof will be omitted.

Figure 8:
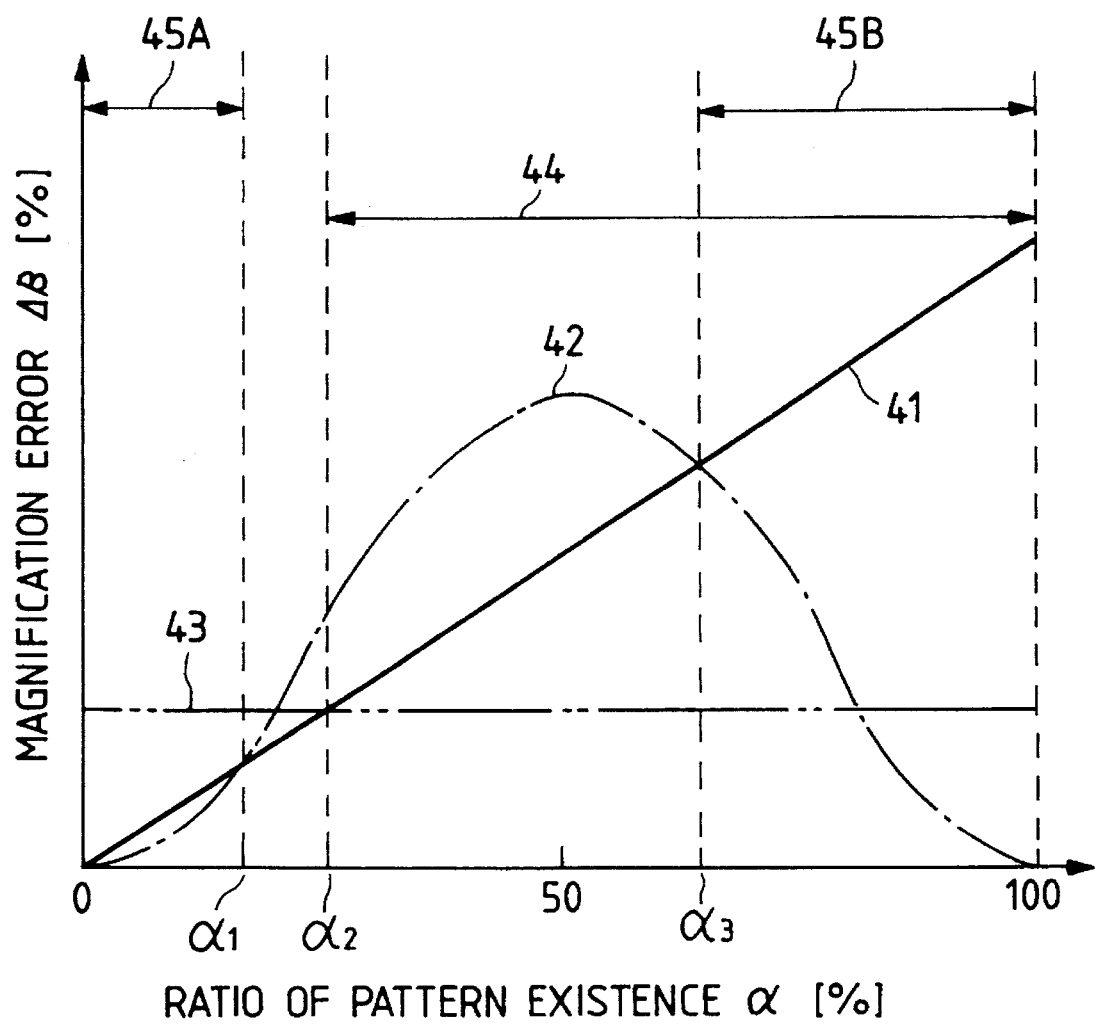
FIG. 8 is a graph showing the relationship between the ratio of pattern existence and the magnification error.

According to this embodiment, the deformation amount of the pattern formation surface of a reticle caused by thermal expansion is obtained by measuring a physical quantity (the illuminance of illumination light, the ratio of pattern existence, the material of a pattern, the reflectance of the pattern, the temperature distribution of the reticle, or the like) corresponding to the deformation amount of the pattern formation surface of the reticle, and the change amount of the imaging state (magnification, distortion, focus position, or the like) on a wafer is estimated from the deformation amount. For example, as shown in FIG. 8, the physical quantity to be measured is assumed to be the ratio of pattern existence $\alpha$, and the imaging state is assumed to be a magnification error $\Delta\beta$. In this case, since the ratio of pattern existence $\alpha$ becomes larger, the thermal expansion amount increases. For this reason, the change amount of the imaging state increases almost in proportion to the ratio of pattern existence $\alpha$, as indicated by a curve 41.

When the pattern is small, the measurement error of the ratio of pattern existence $\alpha$ is small, and contrary to this, when the pattern is large, the measurement error of the ratio of pattern existence $\alpha$ becomes small if the pattern is reversed. For this reason, the measurement error of the ratio of pattern existence $\alpha$ is represented by inverted-U shaped characteristics. Therefore, the error amount of the change amount of the imaging state is expressed by an inverted-U shaped curve 42 on the basis of the measurement result of the ratio of pattern existence $\alpha$. In addition, the error amount, from a target imaging state, of an imaging state obtained when the imaging state (projection magnification) by the projection optical system PL is changed by operating the driving elements 38a to 38c, 39a to 39c, and 40a to 40c becomes almost constant independently of the ratio of pattern existence $\alpha$, as indicated by a curve 43.

Accordingly, when the change amount (curve 41) of the estimated imaging state is larger than the error amount (curve 43), from the target imaging state, of the imaging state obtained when the imaging state is changed (region 44), the imaging state of the projection optical system (PL) is corrected by operating the driving elements 38a to 38c, 39a to 39c, and 40a to 40c. Thus, the imaging characteristics can be prevented from deteriorating upon operation of the driving elements 38a to 38c, 39a to 39c, and 40a to 40c.

In this embodiment, the main control system 20 shown in FIG. 1 acquires information from the power monitor 5, the reflection amount monitor 8, and the radiation amount monitor 16, and calculates the variation amount of the imaging characteristics of the projection optical system PL, as will be described later. In this embodiment as well, the main control system 20 is connected to the memory 21. The memory 21 stores various data (the type of a light-shielding member of the reticle R, the density distribution of the pattern, and the like) necessary for calculating the thermal deformation amount of the reticle R caused by absorption of illumination light. The memory 21 also stores formulas, tables, or the like for calculating the change amount of the imaging state on the basis of the thermal deformation amount.

A method of calculating the variation amount of the imaging characteristics in this embodiment will be described below. This embodiment corrects the variation of the imaging characteristics caused by thermal deformation of the reticle R. In this embodiment, the thermal deformation amount of the reticle R is obtained first upon calculation of the variation amount of the imaging characteristics. The method of obtaining the thermal deformation amount will be described below.

Since it can be considered that the reticle R thermally deforms in proportion to the temperature distribution of the reticle R, the temperature distribution at a certain time of the reticle R need only be detected so as to calculate the thermal deformation amount. For example, as a method of simulating the temperature distribution using a computer, a method of dividing the reticle R into a plurality of predetermined finite elements, and calculating a change in temperature at each point by a difference method or a finite element method is known. In this embodiment, the following description will be given based on a simple difference method.

Figure 7A:
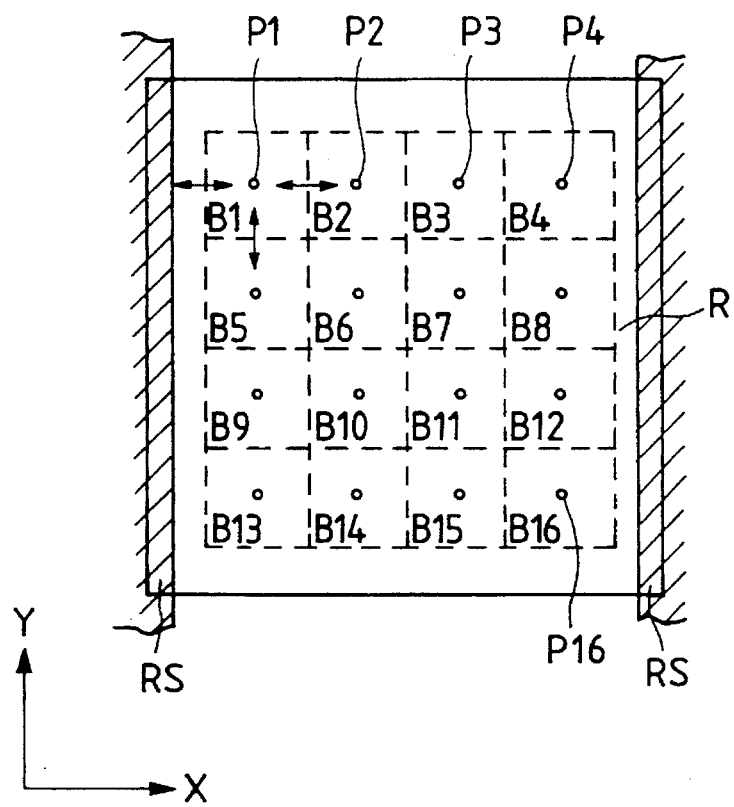
FIG. 7A is a plan view showing a case wherein a reticle R is divided into 16 blocks, pursuant to a second embodiment.

A square exposure area of the reticle R is divided into 4×4 (16) blocks B1 to B17, as shown in FIG. 7A. The central points of the blocks B1 to B16 are respectively represented by P1 to P16. Since the number of divided blocks or selection of a calculation method is determined in consideration of finally required accuracy, the calculation speed of a computer, and the like, this embodiment adopts 16-divided blocks only for the sake of explanation.

The reticle R is uniformly illuminated via the illumination optical system 6 when the shutter 2 shown in FIG. 1 is opened. However, the amount of heat absorbed on the reticle R varies depending on positions due to the pattern distribution on the reticle R. For this reason, the ratios of pattern existence are calculated in units of blocks B1 to B16 on the reticle R. At this time, it is assumed that the amount of heat absorbed in each block is uniform.

The ratio of pattern existence of each of the blocks B1 to B16 is calculated as, e.g., the output ratio between the radiation amount monitor 16 on the Z stage 14 and the power monitor 5. The radiation monitor 16 is a photocell, which is arranged on the Z stage 14, and has a light-receiving surface with a substantially equal aperture size as that of the image field of the projection optical system PL. The Z stage 14 is moved to feed the radiation amount monitor 16 to substantially the central portion of the image field of the projection optical system PL. The radiation amount monitor 16 receives and photoelectrically converts all the components of illumination light radiated onto the wafer W, thereby calculating the radiation amount of illumination light which reaches the surface of the wafer W via the reticle R and the like. The radiation amount depends on the power of illumination light, the transmittance of the reticle R, the size of the variable blind 10, and the like.

The light-receiving surface of the radiation amount monitor 16 is divided into 16 portions in correspondence with the 16-divided blocks on the reticle R, and can independently measure the amounts of light components which are imaged via the respective blocks. At this time, the measurement is performed after the radiation amount monitor 16 and the reticle R are accurately aligned by the Z stage 14. First, the ratios between the outputs from the radiation amount monitor 16 and the output from the power monitor 5 are measured using a reticle on which no pattern is drawn, and thereafter, the output ratios are measured using a reticle on which a pattern is drawn, so as to calculate the ratios of pattern existence. This measurement may be performed every time the reticle is exchanged from one to another, or may be performed in advance for each reticle and may be stored in the memory 21.

The light-receiving surface of the radiation amount monitor 16 need not always be divided if the areas of the blocks are equal to each other. In this case, a radiation amount monitor which has a light-receiving surface corresponding to one block may be prepared on the Z stage 14, and the measurement may be performed by stepping the Z stage within the X-Y plane. Of course, if the ratios of pattern existence are already known based on data in the manufacture of reticles, the measurement need not be performed.

The heat absorption amounts of the blocks are then calculated on the basis of the obtained ratios of pattern existence of the blocks B1 to B16. Each block absorbs heat in proportion to the power of the light source 1 and the ratio of pattern existence. The absorbed heat is dissipated into the air or via the reticle stage Rst. Also, heat transfer occurs between adjacent blocks.

Transfer of heat between, e.g., two objects will be examined below. In this case, it can be basically considered that the amount of heat transfer is proportional to the temperature difference between two objects. Also, the rate of change in temperature upon transfer of heat is proportional to the amount of transferred heat. These parameters can be expressed by the following formulas:

$$\Delta Q = K_1(T_1 - T_2) \quad (T_1 > T_2) \tag{1}$$

$$dT_1/dt = -K_2 \Delta Q \tag{2}$$

$$dT_2/dt = K_3 \Delta Q \tag{3}$$

where $\Delta Q$ is the transferred heat amount, $T_1$ and $T_2$ are the temperatures of the objects, t is time, and $K_1$, $K_2$, and $K_3$ are constants of proportionality. From formulas (1) to (3), the following formulas are established:

$$dT_1/dt = -K_4(T_1 - T_2) \tag{4}$$

$$dT_2/dt = K_5(T_1 - T_2) \tag{5}$$

As is well known, these formulas express a primary delay system, and when the temperatures $T_1$ and $T_2$ have a temperature difference therebetween, they reach a predetermined temperature along exponential curves. The heat distribution on the reticle R is calculated based on the above formulas.

First, taking the block B1 in FIG. 7A as an example, it exchanges heat (heat conduction) with adjacent blocks B5 and B2. Also, the block B1 exchanges heat with the reticle stage Rst and the air. In this case, for the sake of simplicity, the temperature of the air and the temperature of the reticle stage Rst are assumed to be constant. If the temperatures of the blocks are represented by $T_1$ to $T_{16}$, the temperature of the air is represented by $T_O$, and the temperature of the reticle stage Rst is represented by $T_H$, the following formula is established in association with the temperature $T_1$ of the block B1:

$$dT_1/dt = K_{12}(T_2 - T_1) + K_{15}(T_5 - T_1) + K_{10}(T_H - T_1) + K_0(T_O - T_1) + K_P \eta_1 P \tag{6}$$

where $dT_1/dt$ is the time differential of $T_1$, $K_{12}$ and $K_{15}$ are the coefficients of heat exchange between the block B1 and the blocks B2 and B5, $K_{10}$ is the coefficient of heat exchange between the reticle stage Rst and the block B1, and $K_0$ is the coefficient of heat exchange between each block and the air. In addition, $\eta_1$ is the ratio of pattern existence of the block B1, and P is the power of the light source 1, which corresponds to the output from the power monitor 5. $K_P$ is the coefficient for relating the heat amount obtained upon absorption of illumination light by each block to $\eta_1$ and P. The last term in formula (6) expresses the amount of heat absorbed from illumination light, and the other terms express a diffusion process of the absorbed heat. In this case, $T_H$ and $T_O$ are constant and are assumed to satisfy $T_H = T_O$, each block can be expressed by $(T_O + \Delta T)$, and $K_{12}$, $K_{13}$, ... are equal to each other since all the blocks on the reticle consist of quartz glass. In consideration of these facts, formula (6) can be rewritten as:

$$\begin{aligned} d\Delta T_1/dt &= K_R(\Delta T_2 - \Delta T_1) + K_R(\Delta T_5 - \Delta T_1) + \\ & \quad K_H(-\Delta T_1) + K_0(-\Delta T_1) + K_P \eta_1 P \\ &= (-2K_R - K_H - K_0)\Delta T_1 + K_R \Delta T_2 + \\ & \quad K_R \Delta T_5 + K_P \eta_1 P \\ & (\text{for } K_R = K_{12} = K_{13} = \ldots) \end{aligned} \tag{7}$$

When formula (7) is calculated for each of the blocks B1 to B16, the calculation results can be expressed by the following matrix:

$$\begin{bmatrix} \dfrac{d\Delta T_1}{dt} \\ \dfrac{d\Delta T_2}{dt} \\ \cdot \\ \cdot \\ \cdot \\ \dfrac{d\Delta T_{16}}{dt} \end{bmatrix} = \begin{bmatrix} -2K_R - K_H - K_0 & K_R & 0 & 0 & K_R & 0 & 0 & \cdots & 0 \\ K_R & -3K_R - K_0 & K_R & 0 & 0 & K_R & 0 & \cdots & 0 \\ \cdot & & & & & & & \cdots & \cdot \\ \cdot & & & & & & & \cdots & \cdot \\ \cdot & & & & & & & \cdots & \cdot \\ 0 & \cdot & & \cdot & \cdot & & -2K_R - K_H - K_0 \end{bmatrix} \times \begin{bmatrix} \Delta T_1 \\ \Delta T_2 \\ \cdot \\ \cdot \\ \cdot \\ \Delta T_{16} \end{bmatrix} + K_P \begin{bmatrix} \eta_1 P_1 \\ \eta_2 P_2 \\ \cdot \\ \cdot \\ \cdot \\ \eta_{16} P_{16} \end{bmatrix} \tag{8}$$

This matrix corresponds to 16-element simultaneous equations of differential equations of first order, and can be solved by a numerical solution. Alternatively, this matrix can be solved by a method of solving the matrix by expressing differential forms by difference forms as differences between values within very short times (e.g., the calculation period of a computer), i.e., by the difference method.

In formula (8), since the term of a so-called external force is the last term, when the values of the blocks for each unit time, i.e., $\eta_1 P_1$, $\eta_2 P_2$, ... are input to the computer, the values of $\Delta T_1$, $\Delta T_2$, ... in units of times can be calculated. The ratios of pattern existence $\eta_1$, $\eta_2$, ... are obtained by actual measurement, as described above, and the incident light amounts $P_1$, $P_2$, ... are obtained by the power monitor 5 and the radiation amount monitor 16.

The coefficients $K_R$, $K_O$, $K_H$, and $K_P$ can be calculated from the physical properties, flow rate, and the like of the air. Alternatively, experiments may be conducted for various kinds of reticles, and coefficients best suited for practical reticles may be determined.

With the above-mentioned calculations, the temperature distributions $\Delta T_1$ to $\Delta T_{16}$ are obtained. Based on these temperature distributions and the expansion coefficient of the quartz glass, changes in distances between each two of the central points $P_1$ to $P_{16}$ are calculated, and the movements of the respective points on the reticle can be determined. Based on these movements, the variation of the imaging characteristics, e.g., the distortion of an image to be projected onto the wafer W, can be calculated.

In the method described so far, after the temperature distributions $\Delta T$ of the reticle are calculated, the movements of the central points P are calculated, and then, an image distortion is calculated. In place of $\Delta T$, an image distortion (a distortion, a curvature of field, or the like) can be directly calculated. At this time, when the coefficients $K_R$, $K_O$, $K_H$, and $K_P$ are obtained by experiments, the image distortion can be calculated in the form including, e.g., a change in flexure of the reticle R. When the reticle R has very high heat conductivity, and it can be postulated in terms of required accuracy that the reticle R uniformly expands even when a pattern is formed only on a portion of the reticle R or light is radiated only onto a portion of the reticle R, the image distortion can be calculated by simpler calculations without requiring the above-mentioned complex calculations.

Figure 7B:
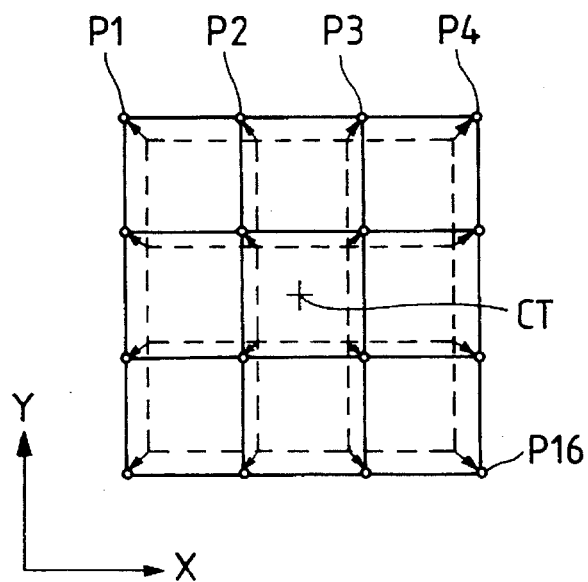
FIG. 7B is a view showing an example of thermal deformation of the reticle R.

More specifically, assuming that the reticle R uniformly expands, the central points $P_1$ to $P_{16}$ of the blocks on the reticle R move outwardly from the center CT of the reticle R, as shown in FIG. 7B. When exposure is performed in this state, a pattern image to be projected onto the wafer W suffers a magnification error. In order to correct the imaging state such as the magnification error, basically, the three groups of lens elements (30, 31), (33), and (35) can be moved in the optical axis direction or an oblique direction to have the axis perpendicular to the optical axis as the rotational axis, as described above.

In this respect, FIG. 8 shows the relationship between the ratio of pattern existence $\alpha$ [%] in a certain block on the reticle, and the magnification error $\Delta\beta$ [%] obtained when a pattern on the block is projected onto the wafer W via the projection optical system PL. As the ratio of pattern existence $\Delta$ becomes higher, the thermal expansion amount of the reticle R becomes large, and the magnification error also becomes large. For this reason, the amount to be corrected of the magnification error increases in almost proportion to the ratio of pattern existence $\alpha$, as indicated by a correction curve 41. The ratio of pattern existence $\alpha$ of the reticle R is calculated from the measurement result of the transmittance of the reticle R. In this case, the measurement error of the transmittance of the reticle R is maximized when the ratio of pattern existence $\alpha$ is in the neighborhood of 50%. Therefore, the deviation amount of the magnification error $\Delta\beta$ calculated based on the measurement result of the ratio of pattern existence $\alpha$ from a true magnification error has an inverted-U shaped distribution which becomes nearly maximum when the ratio of pattern existence $\alpha$ is 50%, as indicated by a measurement error curve 42. When the magnification error $\Delta\beta$ of the projection optical system PL is corrected by operating the imaging characteristic correction apparatus of the projection optical system PL of this embodiment, an almost constant setting error is generated over the entire range of the ratio of pattern existence $\alpha$, as indicated by a correction error curve 43.

In a region where the ratio of pattern existence $\alpha$ is lower than $\alpha_2$ (i.e., a region where the value of the correction error curve 43 is larger than that of the correction curve 41), the amount to be corrected of the magnification error caused by the thermal expansion of the reticle becomes smaller than the setting error caused by the correction operation of the magnification error, and the magnification error is maintained with higher accuracy if the magnification error is not corrected than in a case wherein the magnification error is corrected. Therefore, the magnification error is corrected only in a region 44 where the value of the correction curve 41 is larger than that of the correction error curve 43, thereby preventing a phenomenon that the magnification error is increased by the setting error caused by the correction operation of the magnification error if the magnification error is corrected.

In a region where the ratio of pattern existence $\alpha$ falls within a range between $\alpha_1$ and $\alpha_3$ (in a region where the value of the measurement error curve 42 is larger than that of the correction curve 41), the amount to be corrected of the magnification error caused by the thermal expansion of the reticle becomes smaller than the error component of the magnification error caused by the measurement error of the ratio of pattern existence, and the magnification error is maintained with higher accuracy if the magnification error is not corrected than in a case wherein the magnification error is corrected. Therefore, the magnification error is corrected in only two regions 45A and 45B where the value of the correction curve 41 is larger than that of the measurement error curve 42, thereby preventing a phenomenon that the magnification error is increased by the measurement error of the ratio of pattern existence if the magnification error is corrected. When the entire measurement error curve 42 representing the measurement error as a function of the ratio of pattern existence of the reticle is present below the correction curve 41 indicating the magnification error to be corrected, depending on the material of the reticle, the magnification error can be corrected over the entire range.

Note that the magnification error may be corrected only in the region 45B where the value of the correction curve 41 is larger than those of the measurement error curve 42 and the correction error curve 43. Furthermore, the measurement error curve 42 and the correction error curve 43 described above are obtained by classifying the error factors of the magnification error into two factors for the sake of simplicity. In order to further eliminate the magnification error, the magnification error can be corrected (thermal expansion correction) in a region where the value of the correction curve 41 is larger than the sum of the values of the measurement error curve 42 and the correction error curve 43.

Similarly, as for the material of the pattern, error characteristics similar to those of the ratio of pattern existence $\alpha$ shown in FIG. 8 are obtained. Since a reticle using chromium or the like having a low reflectance as the material of the pattern suffers a smaller measurement error than that of a reticle using a material having a high reflectance, the imaging characteristics can be improved by thermal expansion correction. Error characteristics similar to those in FIG. 8 can be obtained in association with not only the magnification error but also a distortion, a change in focus position, and the like.

As described above, a phenomenon that an error caused by actual correction of the imaging characteristics is larger than the amount to be corrected of the imaging characteristics occurs. Thus, in an actual exposure process, in order to optimize the imaging characteristics independently of situations, exposure conditions are stored as formulas in the memory 21 connected to the main control system 20 on the basis of information associated with the reticle, such as the material of the glass substrate, the material of the pattern on the reticle, the pattern of a circuit diagram drawn on the pattern surface, the ratios of pattern existence on the pattern surface, and the like, and exposure is executed according to the stored exposure conditions.

An example will be described below. The pattern on the reticle R is roughly classified into a pattern for a line-and-space (L/S) pattern and a pattern for contact holes. As can be seen from the conditions described above, since the L/S pattern causes a large measurement error, thermal expansion correction (correction of the imaging characteristics) is performed only for the contact hole pattern. The material of the pattern surface of the reticle R is classified into a material having a high-reflectance pattern and a material having a low-reflectance pattern. In this case, thermal expansion correction (correction of the imaging characteristics) is performed only for a reticle having a low-reflectance pattern surface, which absorbs a large amount of heat.

As a method of determining whether or not the correction means for correcting the imaging characteristics of the projection optical system PL is executed, a reading portion such as a bar code may be provided to a portion which does not influence the pattern area PA of the reticle R, and pattern information indicated by the reading portion may be read while the reticle R is conveyed to the reticle stage Rst or the reticle R is aligned by the reticle stage Rst. The read pattern information is supplied to the main control system 20, and is compared with information input in advance to the main control system. Thus, whether or not correction is to be executed can be determined by an operator or the main control system 20 itself.

As another method, a reflection plate having a high reflectance may be set on the Z stage 14 in FIG. 1, and the intensity of illumination light which is transmitted through the pattern area PA of the reticle R and is reflected by the reflection plate on the Z stage 14 may be detected by the reflection amount monitor 8 on the back surface of the beam splitter 7. The intensity of the reflected light is measured in synchronism with the movement of the Z stage 14, and the degree of fineness of a pattern on the pattern area PA is checked on the basis of the inclination of an intensity curve near the best focus position, thereby allowing correction of coefficients in the formulas for thermal expansion correction of the reticle R.

This method also includes a method of measuring, in advance, information of a pattern, and the like when the reticle R is stored in a cassette portion (not shown) for storing the reticle R, and a method of measuring information of a pattern, and the like in the manufacture. In the former method, every time the reticle is exchanged from one to another, whether or not the correction means is executed can be determined based on information supplied from the cassette portion to the main control system 20. Also, the start timing of correction can be determined based on the reticle state and the energy state of illumination light.

Figure 9:
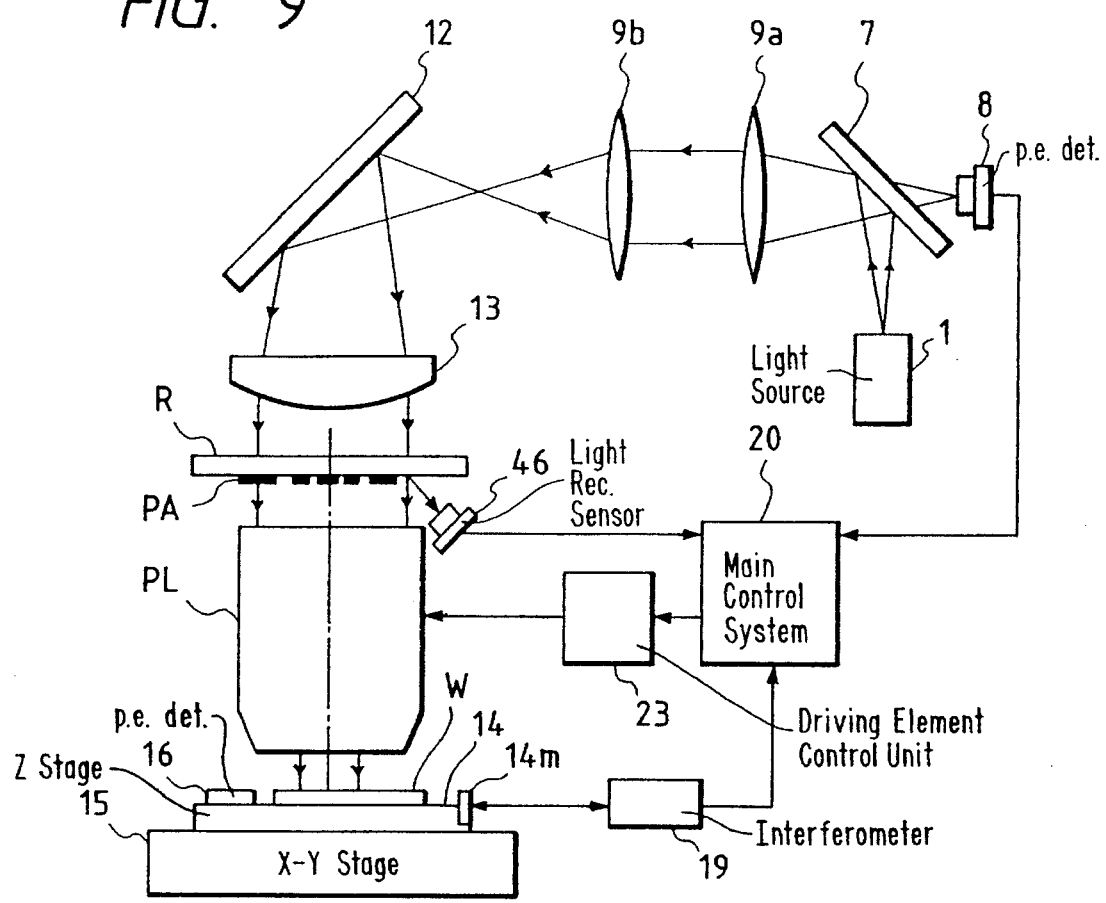
FIG. 9 is a schematic view showing a case wherein diffracted light from the reticle R is measured by a light-receiving sensor which is arranged on the side surface of an upper portion of a projection optical system PL.

Then, in order to measure the thermal deformation amount of the reticle as a pre-process upon execution of correction of the imaging characteristics, the thermal deformation amount is calculated based on the ratio of pattern existence measured by the radiation amount monitor 16 in the above-mentioned embodiment. Instead of this method, in order to directly measure the thermal deformation amount of the reticle, as shown in FIG. 9, diffracted light which is diffracted by the pattern area PA of the reticle R and is not incident on the projection optical system PL may be received by a light-receiving sensor 46 arranged above the projection optical system PL and near the reticle R. When, for example, the pitch of the pattern on the reticle R changes due to thermal deformation, since the amount of diffracted light also changes, the thermal deformation amount of the reticle R can be detected from the detection signal from the light-receiving sensor 46. The detection signal from the light-receiving sensor 46 is supplied to the main control system 20, and the main control system 20 corrects a change in imaging characteristics caused by the thermal expansion of the reticle R via the driving element control unit 23. The change in amount of diffracted light can be measured while a pattern is being printed on the wafer W in practice.

Figure 10:
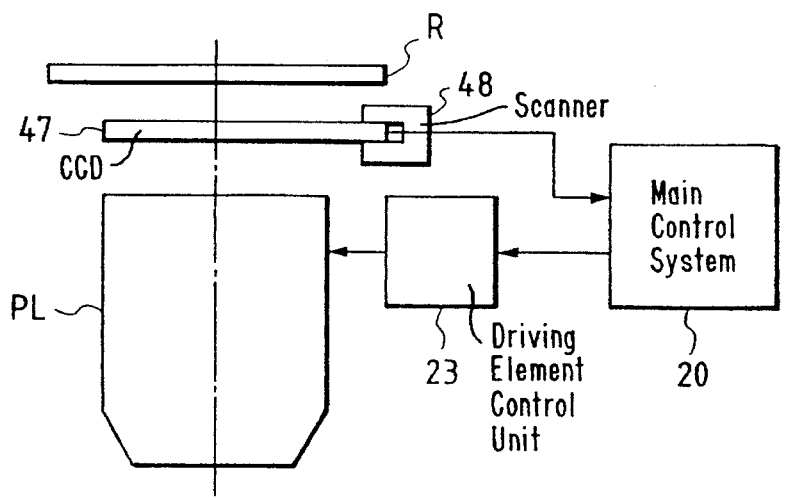
FIG. 10 is a schematic view of main part showing a case wherein light transmitted through the pattern on the reticle R is measured by a light-receiving sensor which is arranged between the projection optical system PL and the reticle R.

On the other hand, as shown in FIG. 10, a scanning device 48 may be arranged on a side surface portion immediately below the reticle R, and a light-receiving sensor 47 such as a two-dimensional CCD may be attached to the scanning device 48. Then, by scanning the lower surface of the reticle R by the light-receiving sensor 47 using the scanning device 48 immediately before exposure or simultaneously measuring the amount of light transmitted through the pattern area on the reticle R using the light-receiving sensor 47, the thermal change amount of the pattern on the reticle R can be directly measured. With this method, the thermal expansion state of the reticle R over a long period of time can be easily measured. This method can accurately measure the thermal expansion state even when a plurality of chip patterns are drawn on the reticle R, and only one divided chip pattern is exposed.

Figure 11:
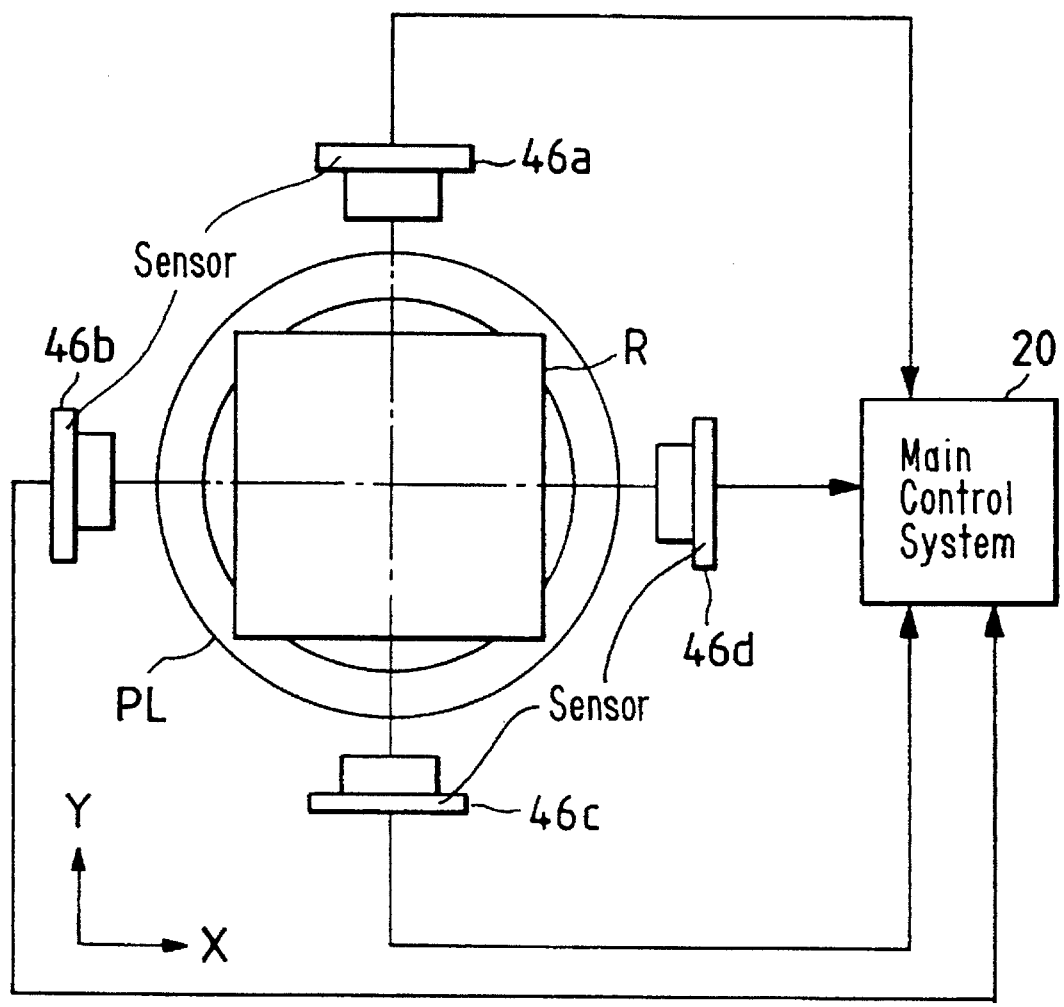
FIG. 11 is a plan view showing a case wherein diffracted light from the reticle R is measured by a plurality of light-receiving sensors which are arranged on the side surface of the upper portion of the projection optical system PL.

Referring back to FIG. 9, it is desirable that a plurality of light-receiving sensors 46 be arranged to surround the projection optical system PL. In this case, since most parts of a pattern formed on the reticle R are orthogonal pattern portions (pattern portions parallel to the X- and Y-directions), high measurement accuracy can be assured when two light-receiving sensors 46b and 46d are arranged on the two sides of pattern portions parallel to each other in the X-direction, and two light-receiving sensors 46a and 46c are arranged on the two sides of pattern portions parallel to each other in the Y-direction, as shown in FIG. 11. Also, in FIG. 9, one or a plurality of light-receiving sensors 46 may be arranged to be movable around the projection optical system PL, thus obtaining the same effect as in FIG. 11.

In addition, a reflection plate (not shown) having a high degree of flatness may be arranged on the Z stage 14 aligned with the focal point position, and a reflected image of an image, which is transmitted through the reticle R and the projection optical system PL, and is imaged on the reflection plate, may be guided to a light-receiving sensor (not shown), arranged at a position conjugate with the pattern area PA, via the projection optical system PL and the reticle R again, so as to measure a change in amount of light. Thus, the thermal expansion coefficient of the reticle R can be measured.

As another method, a non-contact temperature sensor described in the first embodiment may be arranged near the pattern area PA of the reticle R, and the temperature distribution on the surface of the pattern area PA may be directly measured. The thermal expansion state and the temperature distribution on the reticle R are successively measured, and a future thermal expansion state can be predicted by executing image processing and the like of the measurement results. Upon execution of correction of the imaging characteristics based on this thermal deformation amount, exposure can be performed with high accuracy. As in the first embodiment, the temperature distribution on the surface of the pattern area PA can be calculated based on the temperature distribution information TS of the reticle R from the temperature data processing unit 54.

During exposure, when the opening/closing interval of the shutter 2 in FIG. 1, and data such as the accumulation amount of the energy amount of illumination light IL are expressed by formulas by the main control system 20, the imaging characteristics can be corrected in a predictive manner, in the same manner as the above-mentioned method. Upon accumulation of information, control with higher accuracy can be realized. Even during predictive control, actual measurement can be parallelly performed, and when the measurement result is sequentially input to the main control system 20, correction with higher accuracy can be attained.

As described above, according to this embodiment, when the change amount of the imaging state estimated by the main control system is larger than the error amount, from a target imaging state, of an imaging state obtained upon operation of the imaging characteristic correction means, the imaging state of the projection optical system is corrected. For this reason, the imaging characteristics can be prevented from deteriorating upon operation of the imaging characteristic correction means. Therefore, a change in optical characteristics caused by thermal deformation of the reticle R can be satisfactorily corrected.

Therefore, a light-shield member or the like in a pattern on the reticle, which does not provide an adverse influence such as flare on an optical system such as the projection optical system, alignment system, and the like can be selected regardless of heat absorption.

When the change amount of the imaging state estimated by the main control system 20 is larger than the error amount of the change amount of the imaging state estimated by the main control system 20, the imaging state of the projection optical system is corrected. For this reason, when the estimated error amount of the change amount of the imaging state is large, the imaging characteristics can be prevented from being corrected in a wrong direction. Therefore, a change in optical characteristics caused by thermal deformation of the reticle R can be satisfactorily corrected.

When the change amount of the imaging state estimated by the main control system 20 is larger than the error amount, from a target imaging state, of the imaging state obtained when the imaging state by the projection optical system is changed by operating the imaging characteristic correction means, and the error amount of the change amount of the imaging state estimated by the main control system 20, the imaging state of the projection optical system is corrected. In this case, a change in optical characteristics caused by thermal deformation of the reticle R can be corrected more satisfactorily.

Figure 12:
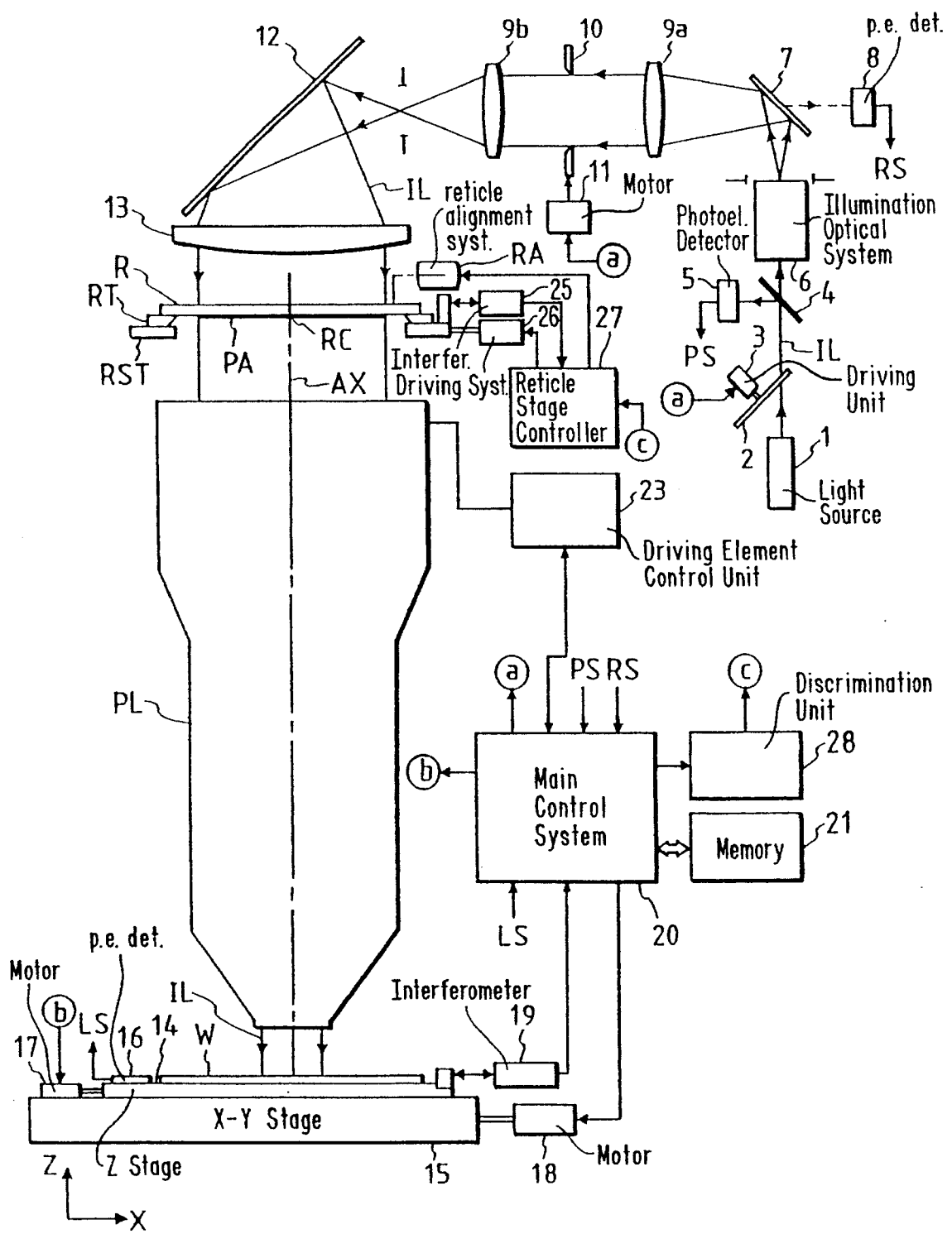
FIG. 12 is a schematic view showing the arrangement of a projection exposure apparatus according to a third embodiment of the present invention.

The third embodiment of the present invention will be described below. FIG. 12 is a schematic view showing the arrangement of a projection exposure apparatus suited for the third embodiment. The same reference numerals in FIG. 12 denote the same parts as in the first and second embodiments, and a detailed description thereof will be omitted.

Referring to FIG. 12, a reticle R is held by the reticle table RT. The reticle table RT, in turn, is placed on a reticle stage RST which is two-dimensionally movable in a plane (X-Y plane) substantially perpendicular to the optical axis AX of the projection optical system PL. The coordinate position, on the X-Y coordinate system, of the reticle R, is sequentially detected by a reticle interferometer 25. A reticle stage controller 27 controls a reticle driving system 26 and a reticle alignment system RA on the basis of a coordinate measurement signal from the reticle interferometer 25, thereby controlling movement and alignment of the reticle stage RST. The reticle R is initially set by finely moving the reticle stage RST on the basis of a mark detection signal from the reticle alignment system RA for photoelectrically detecting alignment marks AM (FIG. 13) on the peripheral portion of the reticle. The reticle R is aligned, so that a central point CT of a pattern area PA coincides with the optical axis AX of the projection optical system PL. The reticle R to be used is properly exchanged from one to another by a reticle exchanger (not shown). In particular, when a large number of types of products are produced in small quantities, reticles are exchanged frequently.

The memory 21 shown in FIG. 12 stores various data (the type of a light-shielding member of the reticle, the density distribution of a pattern, and the like) required for calculating the thermal deformation amount of the reticle caused by absorption of exposure light, formulas or tables for calculating the change amount of the imaging state in correspondence with the thermal deformation amount of the reticle, and the like. The main control system 20 calculates the thermal deformation amount of the reticle R, as will be described later, on the basis of information from the memory 21, the power monitor 5, the reflection amount monitor 8, and the radiation amount monitor 16, and outputs the calculated information to a discrimination unit 28. Furthermore, the main control system 20 calculates a variation amount of imaging characteristics corresponding to the thermal deformation amount of the reticle R, and issues instructions to the driving element control unit 23.

Figure 13:
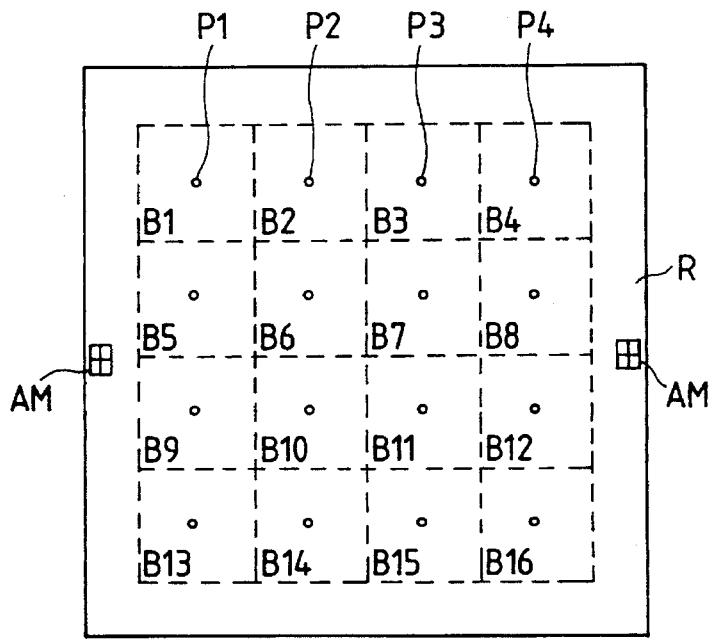
FIG. 13 is a top view showing a state wherein a pattern area PA on a reticle, where alignment marks are arranged, is divided into 16 portions.

In this embodiment as well, the temperature distribution of the reticle R is simulated using a relatively simple difference method. First, the pattern area PA on the reticle R is divided into 4×4 (16) blocks, as shown in FIG. 13, and the divided blocks are represented by B1 to B16. The central points of these blocks are represented by P1 to P16.

A reticle on which no pattern is drawn is aligned, so that the central point of the reticle coincides with the optical axis AX of the projection optical system. Then, the X-Y stage 15 is moved to feed the radiation amount monitor 16 to substantially the central portion of the projection optical system PL. Since the light-receiving surface of the radiation amount monitor 16 has substantially the same area as the image field of the projection optical system PL, the radiation amount monitor 16 receives and photoelectrically detects all the light components of exposure light radiated onto the wafer W. At this time, the radiation amount monitor 16 is divided into 16 portions in correspondence with the 16-divided blocks of the reticle R, and can independently measure the amounts of light components passing through the corresponding blocks. At this time, the power monitor 5 photoelectrically detects illumination light IL. The same operations as described above are performed for a reticle on which a pattern is drawn. Then, the ratios of pattern existence on the reticle are calculated on the basis of the ratios between the levels of the output signals from the radiation amount monitor 16 and the level of the output signal from the power monitor 5 obtained from the reticle on which no pattern is drawn, and the ratios between the levels of the output signals from the radiation amount monitor 16 and the level of the output signal from the power monitor 5 obtained from the reticle on which a pattern is drawn.

In the above-mentioned measurement, a reticle on which no pattern is drawn is used. Alternatively, illumination light may be radiated in a state wherein no reticle is set, and the ratios between the levels of the output signals from the radiation amount monitor 16 and the level of the output signal from the power monitor 5 may be calculated.

The operation of this embodiment will be described below.

The parameters of the above-mentioned formula (8) for calculating a variation of the imaging state caused by thermal deformation of the reticle R must be determined in the manufacture of the apparatus, and must be stored in the memory 21.

The parameter $K_R$ associated with heat conduction of the reticle R is determined by the material, thickness, and the like of glass as the major material of the reticle R. This value can be obtained by a physical property value or experiments, as described above. The parameters $K_O$ and $K_H$ are associated with heat conduction between the glass substrate, and the reticle table RT and the air, and are determined by the material of the glass substrate. Since the parameter $K_P$ is associated with heat absorption by the light-shielding portion and the glass material of the reticle R, it is determined by the materials of the light-shielding portion and the glass material of the reticle.

These parameters must be stored in the memory 21 in the form of functions or tables of physical property values of, e.g., glass as the material of the reticle R. However, these parameters may assume constant values if the influence on the final imaging state is a negligible value.

When the parameters are obtained by experiments, since the projection optical system PL itself absorbs illumination light, thermal deformation of only the reticle R is purely measured as follows. After both the reticle R and the projection optical system PL reach a fully equilibrated state to the external temperature, an image on the reticle R is exposed onto the wafer W. Thereafter, a light-shielding member is inserted between the reticle R and the projection optical system PL, and illumination light is radiated by opening the shutter 2 for a predetermined period of time. Then, the light-shielding member is removed, the image on the reticle R is exposed onto the wafer W again, and the exposed image is compared with the image exposed previously, thereby detecting the change amount of the imaging state caused by thermal deformation of the reticle R. After the change in state caused by the thermal deformation of the reticle R is sufficiently corrected by this method, the illumination light is radiated in a state without the light-shielding member, thus allowing detection of absorption of the illumination light by the projection optical system PL. In this manner, the change amount of the imaging state caused by thermal deformation of the reticle upon absorption of illumination light, and the change amount of the imaging state caused by thermal deformation of the projection optical system upon absorption of illumination light can be independently corrected. Even when a reticle is exchanged from one to another during the operation, correction can be accurately performed. The change amount of the imaging state caused upon absorption of illumination light by the projection optical system PL can be corrected by the conventional technique.

As described above, in order to calculate the thermal deformation amount of the reticle R, the types of the glass material and light-shielding member of the reticle R, the ratios of pattern existence of the individual blocks, and the numerical aperture of the variable blind 10 are required. Of these data, the attributes of the reticle R are actually measured in units of reticles or are stored in advance in the memory 21.

The heat absorption ratio of chromium as the light-shielding member can be estimated to some extent from the reflectance of chromium. A reflection surface having a known reflectance is brought to the stage side (lower side in FIGS. 1 and 12) of the projection optical system, and the output signal from the reflection amount monitor 8 at that time is stored. The reflectance can be calculated by calculating light components reflected by the reticle surface on the basis of this output signal, the ratios of pattern existence of the reticle, which are calculated in advance, and reflectance components of other lens members.

During the exposure operation, optical information signals (intensity values) LS, RS, and PS from the power monitor 5, the reflection amount monitor 8, and the radiation amount monitor 16 are output to the main control system 20. The main control system 20 calculates the changes in imaging state caused by heat absorption by the reticle R and the projection optical system PL on the basis of these information signals and the above-mentioned data stored in the memory 21, and then calculates a total change amount. When the imaging state of the projection optical system PL also changes due to other factors such as a change in atmospheric pressure, the change amounts caused by these factors are totaled.

Figure 14:
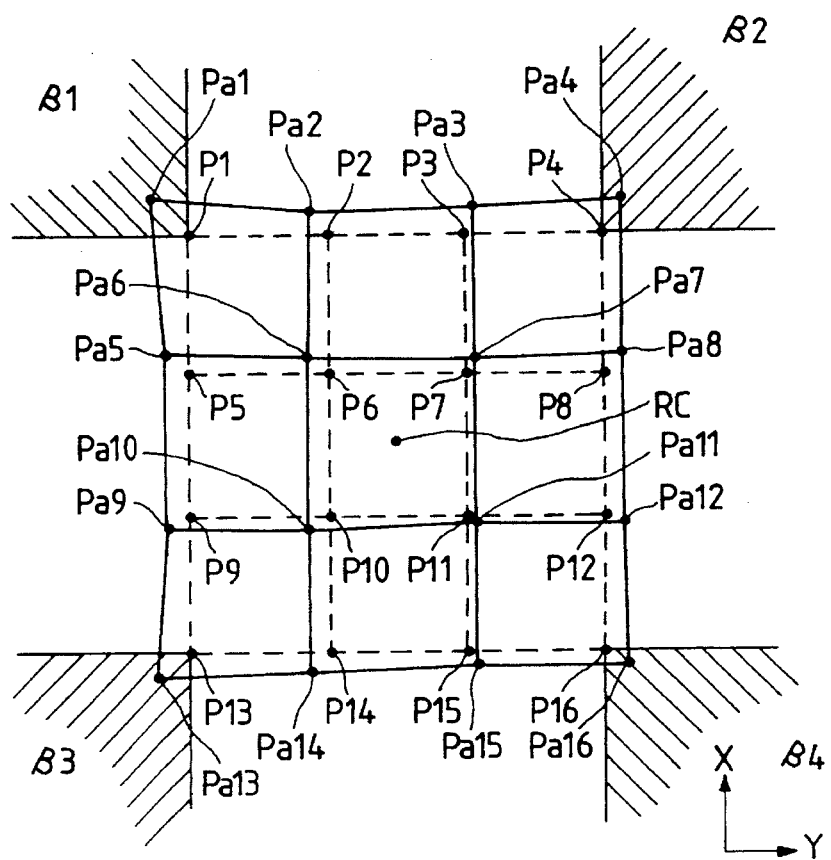
FIG. 14 is a view illustrating thermal deformation of a reticle.

FIG. 14 shows a lattice (to be referred to as an ideal lattice hereinafter) defined by the central points (P1 to P16) of the blocks on the pattern area PA of the reticle R, and a lattice (to be referred to as a reticle lattice hereinafter) defined by the central points (Pa1 to Pa16) of the blocks after thermal deformation of the pattern area PA, which are calculated by the above-mentioned calculations. A region β1 on the X-Y coordinate system in FIG. 14 is a region opposite to the side where the ideal lattice (P1 to P16) exists, to have the X-coordinate value of the point P1 as a boundary in the X-direction, and is also a region opposite to the side where the ideal lattice exists, to have the Y-coordinate value of the point P1 as a boundary in the Y direction. Similarly, regions β2, β3, and β4 are regions opposite to the side where the ideal lattice exists, to respectively have the X-coordinate values of the points P4, P13, and P16 as boundaries in the X-direction, and are regions opposite to the side where the ideal lattice exists, to respectively have the Y-coordinate values of these points as boundaries in the Y-direction. As shown in FIG. 14, the main control system 20 calculates a thermal deformation amount obtained under the assumption that the reticle R thermally deforms while the coordinate position of the central point RC of the pattern area is fixed. This point serves as a reference when the variation amount of the imaging characteristics caused by the thermal deformation of the pattern area is corrected by the lens elements in the projection optical system PL. Therefore, the thermal deformation amount is calculated with reference to a point where the optical axis AX of the projection optical system PL and the reticle R cross, i.e., the central point RC of the pattern area.

Then, the main control system 20 calculates an optimal correction amount of the imaging state of the pattern of the reticle R after thermal deformation. The main control system 20 issues instructions to the driving element control unit 23 to drive the lens elements in the projection optical system PL, thereby correcting the imaging state. Since the arrangement for correcting the imaging characteristics by driving the lens elements, and the correction method using this arrangement are as described above, and are also described in U.S. Pat. No. 5,117,255, a detailed description thereof will be omitted.

Figure 15A:
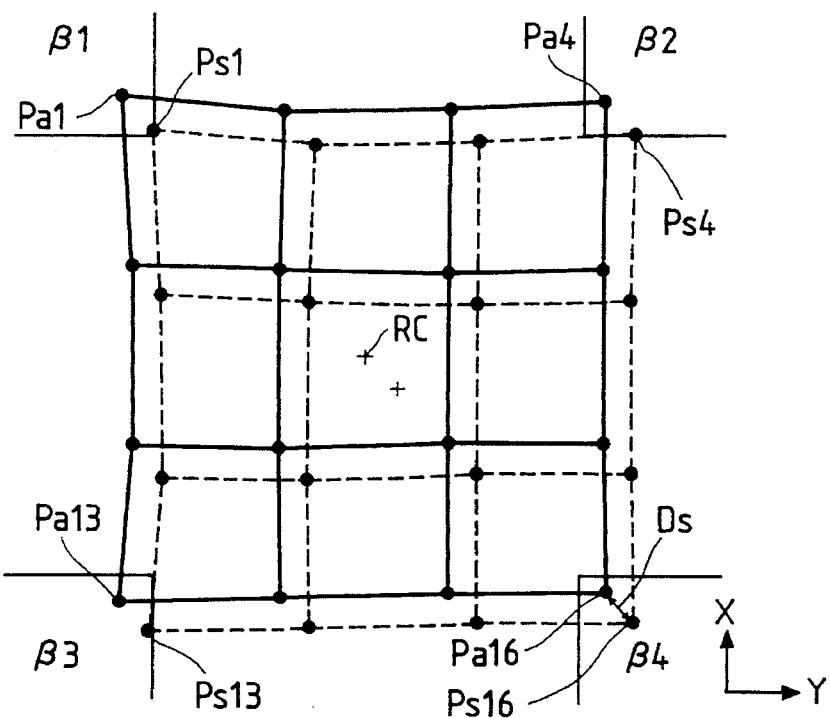
FIG. 15A is a view showing reticle lattices obtained when the shift amount, in the X-Y direction, of the deformed reticle is maximum.
Figure 15B:
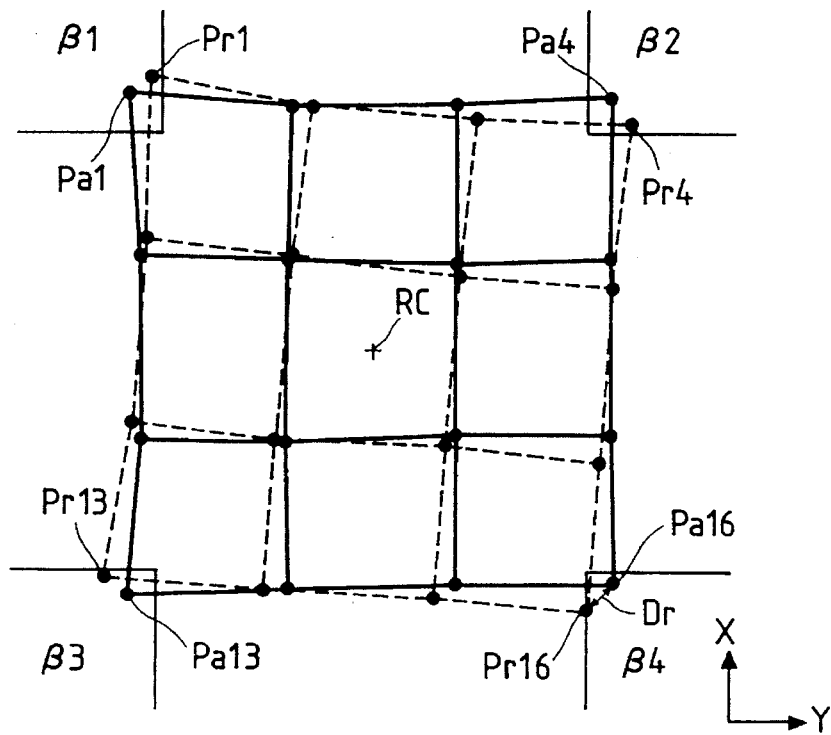
FIG. 15B is a view showing reticle lattices obtained when the rotation amount, in the X-Y plane, of the deformed reticle is maximum.

The main control system 20 corrects the imaging characteristics of the projection optical system PL, and outputs information associated with the thermal deformation amount of the reticle (FIG. 14) to the discrimination unit 28. The discrimination unit 28 calculates movable ranges (regions) β1, β2, β3, and β4 within which the vertices P1, P4, P13, and P16 of the ideal lattice (P1 to P16) of the pattern area PA can move upon the thermal deformation on the basis of the thermal deformation amount (expansion amount) of the ideal lattice obtained by the above-mentioned calculations. These ranges are set under a presupposition that since the thermal deformation amount obtained by the calculations represents a deformation of the entire pattern area in expansion directions, even when the reticle lattice points Pa1 to Pa16 are displaced by the thermal deformation, the vertices P1, P4, P13, and P16 of the pattern area do not deform (move) in contraction directions with respect to the X- or Y-direction. However, since the above-mentioned four regions shown in FIG. 14 are determined for the sake of simplicity in this embodiment, the present invention is not particularly limited to these regions. The discrimination unit 28 then calculates a value for maximizing a displacement amount obtained when the reticle lattice points Pa1 to Pa16 are displaced in the X-Y plane direction, so that all the four vertices Pa1, Pa4, Pa13, and Pa16 respectively exist within the regions β1, β2, β3, and β4. FIGS. 15A and 15B show the state of the reticle lattice at that time.

FIG. 15A shows the reticle lattice points (Pa1 to Pa16) shown in FIG. 14, and a state wherein these reticle lattice points (Pa1 to Pa16) are moved in the X-Y direction. A point Ps1 exists at the vertex (a point where the ideal lattice point P1 existed) of the region β1, and a point Ps13 exists on a boundary, in the Y-direction, of the region β3. Points Ps4 and Ps16 exist within the ranges of the regions β2 and β4. The shape (size) of the reticle lattice (points Ps1 to PS16) obtained under the assumption that the reticle R thermally deforms while the coordinate positions of points other than the central point RC of the pattern area are fixed is the same as that of the reticle lattice (points Pa1 to Pa16) obtained when the reticle thermally deforms while the coordinate position of the central point RC of the pattern area is fixed. The discrimination unit 28 calculates a relative displacement amount (deviation amount) Ds between these two reticle lattices in the direction of the X-Y plane.

This embodiment also considers rotation caused by the thermal deformation of the reticle. FIG. 15B shows a reticle lattice (points Pr1 to Pr16) having a maximum rotation amount under the assumption that the deformed reticle is rotated around the central point RC of the pattern area PA in the X-Y plane. A point Pr16 exists on a boundary line, extending in the X-direction, of the region β4. The discrimination unit 28 calculates a deviation amount Dr, in the X-Y plane, between the four vertices (Pa1, Pa4, Pa13, and Pa16) of the thermally deformed reticle lattice, which are calculated in the same manner, as described above, and the four vertices (Pr1, Pr4, Pr13, and Pr16) of the reticle lattice obtained under the assumption that the reticle is rotated.

These deviation amounts Ds and Dr can be easily calculated using the coordinate positions of the four vertices Pa1, Pa4, Pa13, and Pa16 of the deformed reticle, and the central point RC, and conditions of the regions β1 to β4 as the movable ranges of the corresponding vertices on a static coordinate system.

The discrimination unit 28 stores in advance an allowable range of the deviation amount of the reticle (the reticle lattice), which does not influence the imaging characteristics of a pattern. When at least one of the calculated deviation amounts Ds and Dr exceeds the allowable range, the discrimination unit 28 outputs an instruction signal to a reticle stage controller 27 to perform reticle alignment. The discrimination unit 28 outputs information associated with the shape (size) of the thermally deformed reticle lattice received from the main control system 20 to the reticle stage controller 27 together with this instruction signal.

Upon reception of the instruction signal, the reticle stage controller 27 controls the reticle alignment system RA to detect reticle marks AM arranged on the reticle R. Since the shape (size) of the thermally deformed reticle can be detected from the information associated with the reticle lattice received from the discrimination unit 28, the reticle stage controller 27 and the reticle alignment system RA execute alignment of the reticle R on the basis of the shape of the deformed reticle. In this case, if the actual deviation amount of the reticle R falls within the above-mentioned allowable range, or if the position of the reticle R is near an initial setting position (a position where the central point of the reticle R coincides with the optical axis AX of the projection optical system), the reticle stage RST need not be moved to align the reticle R to the initial setting position.

As described above, since a change in imaging characteristics caused by thermal deformation of the reticle R upon absorption of illumination light is corrected by moving the lens elements in the projection optical system PL, and the shifted or rotated state of the reticle caused by the thermal deformation is corrected by reticle alignment, the pattern area on the thermally deformed reticle can be overlaid on the shot area on the wafer with higher accuracy. When the reticle alignment is performed, the main control system 20 sets new movable ranges β1, β2, β3, and β4 of the vertices of the reticle lattice. At this time, since the reticle position after alignment is known, the regions are determined with reference to the vertices of the reticle lattice in the same manner as the above-mentioned conditions. On the other hand, when radiation of illumination light onto the reticle is stopped for a long period of time, or when the intensity of illumination light is lowered, the calculated thermal deformation amount of the reticle lattice may have a minus sign (i.e., may represent a deformation in a contraction direction). In this case, it is assumed that the movable ranges β1, β2, β3, and β4 of the four vertices of the reticle lattices are ranges (on the side where the ideal lattice exists in both the X- and Y-directions) symmetrical about the vertices P1, P2, P3, and P4 of the ideal lattice, and the deviation amount of the reticle can be estimated by the same method as in the above embodiment.

In this embodiment, the above-mentioned calculations may be performed at predetermined time intervals from the beginning of exposure until the reticle becomes thermally stable, so as to update data associated with the thermal deformation amount and the deviation amount of the reticle. The lens element groups may be driven based on the updated data so as to align the reticle. In addition, the above-mentioned calculations can be performed at arbitrary timings, and e.g., may be properly performed in correspondence with, the open/close timings of the shutter 2. Also, the above-mentioned calculations may be performed all the time from the beginning of exposure.

If it is assumed in FIG. 15A that the deformed reticle is rotated, the discrimination unit 28 may calculate a rotation amount (rotational angle) θ in place of the deviation amount Dr. At this time, the discrimination unit 28 independently stores the allowable range corresponding to the shift amount (positional deviation amount) obtained under the assumption that the reticle is shifted, and the allowable range corresponding to the rotational amount (rotational deviation amount) obtained under the assumption that the reticle is rotated, and compares these two ranges. In this embodiment, only the shift amount Ds of the reticle shown in FIG. 15A may be calculated without considering rotation of the reticle.

Furthermore, in this embodiment, the deviation amounts corresponding to a case wherein the reticle is only shifted and a case wherein the reticle is only rotated are independently calculated. However, the deviation amount of the reticle under the assumption that the reticle is shifted and rotated may be calculated. The deviation amount of the reticle here means a maximum value of the deviation amounts between the calculated vertices (Pa1, Pa4, Pa13, and Pa16) of the thermally deformed reticle lattice, and the vertices (Pa1', Pa4', Pa13', and Pa16') of the thermally deformed reticle lattice obtained under the assumption that the reticle is shifted and rotated.

In this embodiment, the reticle R is divided into 16 blocks, and the thermal deformation amount of the central point of each block is calculated. Since the accumulated radiation energy of illumination light radiated onto the reticle is almost proportional to the thermal deformation amount of the reticle, the thermal deformation amount of the reticle can be obtained from the accumulated radiation energy of illumination light radiated onto the reticle to some extent. When the correspondence between the thermal deformation amount of the reticle and the deviation amount obtained upon thermal deformation of the reticle, and the allowable range of the deviation amount are stored in advance in the memory 21, the accumulated radiation energy radiated onto the reticle during the exposure operation is sequentially calculated, and whether or not reticle alignment is performed can be determined on the basis of the calculated value of the accumulated radiation energy.

As described above, according to this embodiment, when it is assumed that the reticle deviates from its normal position in the reference plane upon thermal deformation caused by absorption of illumination light by the reticle R, the deviation amount can be easily estimated. Since the position, in the reference plane, of the reticle R is detected only when the deviation amount has a value which influences the imaging characteristics of a pattern onto a photosensitive substrate, the number of times of detection of the position of the reticle R can be minimized. When the deviation of the actual position of the reticle R adversely influences the imaging characteristics of the pattern, since the deviation is corrected, the overlapping accuracy of a pattern image is further improved without greatly decreasing the throughput, and an accurate imaging operation can be realized.

The fourth embodiment of the present invention will be described below.

Figure 16:
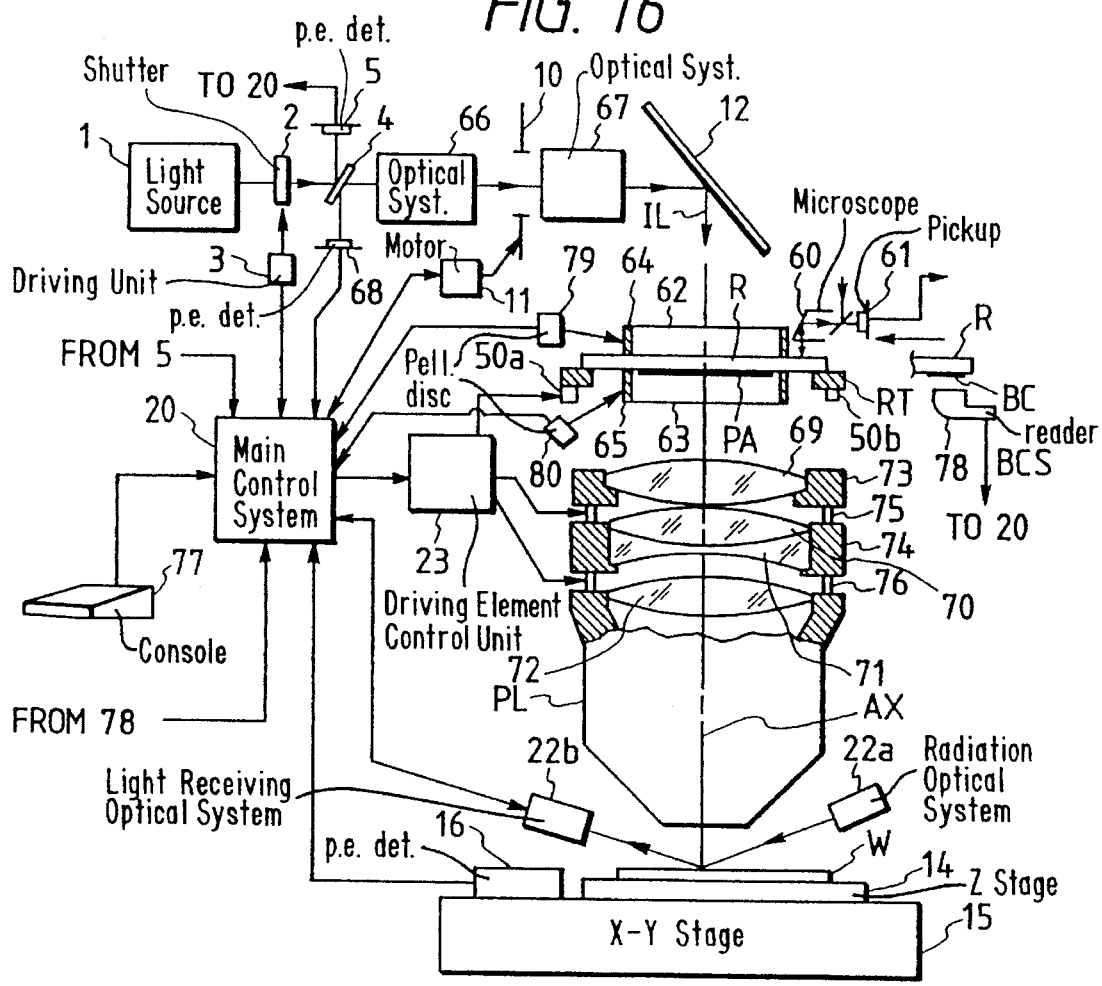
FIG. 16 is a schematic view showing the overall arrangement of a projection exposure apparatus according to a fourth embodiment of the present invention.

FIG. 16 is a schematic view showing the arrangement of a projection exposure apparatus suited for this embodiment. The same reference numerals in FIG. 16 denote the same parts as in the above embodiments, and a detailed description thereof will be omitted.

Referring to FIG. 16, the reticle R is held on the reticle table RT as in FIG. 1, and the reticle table RT is placed on the reticle stage Rst (not shown in FIG. 16), which is supported to be two-dimensionally movable in the horizontal plane via the plurality of driving elements 50a, 50b, and 50c (the driving element 50c is not shown in FIG. 16), which are free to expand and contract. A reticle alignment microscope 60 is arranged above the reticle R, and light reflected by alignment marks on the reticle R is guided to an image pickup element 61 via the reticle alignment microscope 60. The positions of the alignment marks are detected using an image pickup signal from the image pickup element 61, and the reticle R is aligned on the basis of this detection result. The image pickup signal from the image pickup element 61 is also used for calculating the reflectance of a pattern.

Protective films (to be referred to as "pellicles" hereinafter) 62 and 63 for preventing attachment of foreign matter extend on the upper and lower surfaces of the reticle R via rectangular frames (to be referred to as "pellicle frames" hereinafter) 64 and 65. The pellicle frames 64 and 65 normally consist of a metal, and are adhered to the glass substrate of the reticle R by an adhesive applied in advance to the pellicle frames 64 and 65, when they are used.

Figure 17:
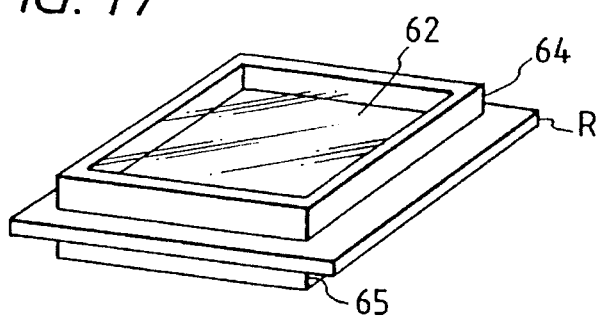
FIG. 17 is a perspective view showing a reticle with pellicles.

FIG. 17 is a perspective view of the reticle R. As shown in FIG. 17, spaces surrounded by the pellicles 62 and 63, the pellicle frames 64 and 65, and the glass substrate of the reticle R form sealed air chambers on the upper and lower surfaces of the reticle R.

Referring back to FIG. 16, when the driving element control unit 23 controls the expansion/contraction amounts of the driving elements 50a, 50b, and 50c, the reticle R can be translated in the direction of the optical axis AX of the projection optical system PL, and can be inclined at an arbitrary angle with respect to a plane perpendicular to the optical axis AX. With this arrangement, the imaging characteristics of the projection optical system, in particular, pin-cushion and barrel distortions, can be corrected. Note that the reticle R is aligned, so that the central point of the pattern area PA coincides with the optical axis AX. Illumination light reflected by the pattern on the reticle R, and illumination light returned from the projection optical system PL side return to the half mirror 4 respectively via second and first partial optical systems 66 and 67, and the like, and light beams reflected by the half mirror 4 are detected by a photoelectric conversion element 68.

Illumination light IL transmitted through the pattern area PA of the reticle R is incident on the double-telecentric projection optical system PL, and the projection optical system PL projects (images) a projected image of the circuit pattern on the reticle R on one of shot areas on the wafer W, on the surface of which a photoresist layer is formed, and the surface of which is held to substantially coincide with the best imaging plane of the projection optical system PL. In this embodiment, some lens elements constituting the projection optical system PL, i.e., a lens element 69 and lens elements (70, 71) in FIG. 16, can be independently driven by the driving element control unit 23 in the same manner as in the first embodiment, and the imaging characteristics of the projection optical system PL, i.e., the projection magnification, distortion, and the like, can be corrected. A variable aperture stop (not shown) is arranged on or near the pupil plane of the projection optical system PL, thereby changing a numerical aperture NA of the projection optical system PL.

The wafer W is chucked by vacuum on a wafer holder (θ table) on the Z stage 14. The wafer stage 15 can be inclined in an arbitrary direction with respect to the best imaging plane of the projection optical system PL, and can be driven in the optical axis direction (Z-direction) of the projection optical system. In addition, the wafer stage 15 is two-dimensionally movable by the step-and-repeat method. Upon completion of transfer exposure of the reticle R on one shot area of the wafer W, the wafer stage 15 is stepped to the next shot position. Note that the arrangement and the like of the wafer stage 15 are disclosed in, e.g., U.S. Pat. No. 4,770,531. As described above, the position, in the vertical direction (Z-direction), of the wafer surface with respect to the best imaging plane is detected on the basis of the detection signal from the light-receiving optical system 22b, and the wafer stage 15 is driven in the Z-direction on the basis of the detection result, so as to maintain a predetermined interval between the wafer W and the projection optical system PL.

In this embodiment, the angle of a plane-parallel glass (not shown) arranged in the light-receiving optical system 22b is adjusted, so that the best imaging plane of the projection optical system PL serves as a zero-point reference, thereby calibrating a wafer position detection system. In addition, the inclination of a predetermined area on the wafer W with respect to the best imaging plane can be detected by using a horizontal position detection system disclosed in, e.g., U.S. Pat. No. 4,558,949, or by arranging the wafer position detection system, so that focal point positions at a plurality of arbitrary positions in the image field of the projection optical system PL can be detected (e.g., by projecting a plurality of slit images into the image field).

Furthermore, in FIG. 16, the main control system 20 systematically controls the entire apparatus. An operator inputs information such as the presence/absence of pellicles, the thickness of the glass substrate of the reticle R, and the like, to the main control system 20 via a console 77, as needed. A bar code reader 78 for reading a bar code BC, which is formed aside a reticle pattern and represents the name of the reticle, during conveyance of the reticle R to a position immediately above the projection optical system PL, is arranged. Information BCS of the name of the reticle read by the bar code reader 78 is supplied to the main control system 20.

Pellicle discriminators 79 and 80 are respectively arranged above and below the reticle table RT. Each of the pellicle discriminators 79 and 80 comprises a photoelectric sensor, a mechanical limit switch, or the like. These pellicle discriminators 79 and 80 actually detect whether or not the pellicle frames 64 and 65 or the pellicles 62 and 63 are attached to the upper and lower surfaces of the reticle R. These detection results are also output to the main control system 20. The main control system 20 calculates the thermal deformation amount of the reticle on the basis of information input from the console 77, information read by the bar code reader 78, information detected by the pellicle discriminators 79 and 80, or the like, as will be described later.

An imaging state correction means of this embodiment will be described below. This correction means is arranged, in essence, for the purpose of correcting a change in imaging characteristics of the projection optical system PL itself caused by a change in atmospheric pressure, a change in temperature, or absorption of exposure light. In this embodiment, the correction means is used for correcting a change in imaging characteristics caused by the thermal deformation of the reticle. The change in imaging characteristics includes various modes. In this embodiment, only components which are generated by the thermal deformation of the reticle will be explained. First, a change in magnification $\Delta M$, a trapezoidal distortion $\Delta T$, and a distortion (so-called barrel or pin-cushion distortion) $\Delta D$ which are caused by thermal expansion of the reticle, and a curvature of field $\Delta C$ which is caused by the flexure of the reticle will be examined.

A correction mechanism will be described first. As shown in FIG. 16, in this embodiment, when the reticle R, the lens element 69, and the lens elements (70, 71) are independently driven by the driving element control unit 23, the change in imaging characteristics can be corrected.

The first lens element group 69 closest to the reticle R is fixed to a support member 73, and the second lens element group (70, 71) is integrally fixed to a support member 74. Lens elements below (in FIG. 16) a third lens element group 72 are fixed to a lens barrel portion of the projection optical system PL. In this embodiment, the optical axis AX of the projection optical system PL means that of the lens elements fixed to the lens barrel portion.

The support member 73 is coupled to the support member 74 via a plurality of driving elements 75 (e.g., three elements; two elements are illustrated in FIG. 16) which are free to expand and contract, and the support member 74 is coupled to the lens barrel portion via a plurality of driving elements 76 which are free to expand and contract. Each of the driving elements 50 (50a, 50b, and 50c), 75, and 76 comprises an electrostrictive element (piezoelectric element), a magnetostrictive element, or the like, and the displacement amount of each driving element corresponding to a voltage or magnetic field applied thereto is measured in advance. Although not shown, a position detector such as a linear encoder, a capacitive displacement sensor, a differential transformer, or the like is provided to the driving elements in consideration of the hysteresis characteristics of the driving elements, and the positions of the driving elements corresponding to the voltage or magnetic field applied thereto are monitored, thus realizing accurate driving control.

When each of the lens element 69 and the lens elements (70, 71) are respectively translated in the optical axis direction, a projection magnification M, a curvature of field C, and a focal point position F respectively change at the change rates corresponding to their moving amounts. If the driving amount of the lens element 69 is represented by $x_1$, and the driving amount of the lens elements (70, 71) is represented by $x_2$, change amounts $\Delta M$, $\Delta C$, and $\Delta F$ of the projection magnification M, the curvature of field C, and the focal point position F are respectively given by:

$$\Delta M = C_{M1} \times x_1 + C_{M2} \times x_2 \tag{9}$$

$$\Delta C = C_{C1} \times x_1 + C_{C2} \times x_2 \tag{10}$$

$$\Delta F = C_{F1} \times x_1 + C_{F2} \times x_2 \tag{11}$$

where $C_{M1}$, $C_{M2}$, $C_{C1}$, $C_{C2}$, $C_{F1}$, and $C_{F2}$ are constants representing the change rates of the change amounts with respect to the driving amounts of the lens elements, and $\Delta F$ is the change amount of the focal point position.

Figure 18:
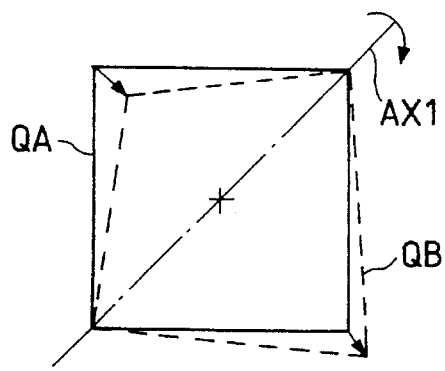
FIG. 18 is a view showing an example of correction of a distortion of a projected image by an imaging characteristic correction mechanism of the fourth embodiment.

When the lens element 69 is inclined (rotated) to have a straight line perpendicular to the optical axis AX as a rotational axis, the trapezoidal distortion $\Delta T$ changes. FIG. 18 shows this state. Referring to FIG. 18, if a square pattern QA indicated by a solid line represents the projected image of the reticle R, when the lens element 69 in FIG. 16 is inclined to have an axis AX1 indicated by an alternate long and short dashed line as a rotational axis, the projected image can be distorted, as indicated by, e.g., a trapezoidal pattern QB indicated by a dotted line.

Therefore, the trapezoidal distortion $\Delta T$ is determined by an inclination angle $\theta_1$ of the lens element 69 and the direction of the rotational axis AX1. Assuming that the direction of the rotational axis AX1 is fixed in a predetermined direction for the sake of simplicity, the trapezoidal distortion $\Delta T$ is given by the following formula using the inclination angle $\theta_1$ and a change rate $C_{T1}$ corresponding to the inclination angle. If the image plane inclination amount at that time is represented by $\Delta L$, the image plane inclination amount $\Delta L$ is expressed as follows using a change rate $C_{T2}$.

$$\Delta T = C_{T1} \theta_1 \tag{12}$$

$$\Delta L = C_{T2} \theta_1 \tag{13}$$

As described above, the wafer position detection system (22a, 22b) shown in FIG. 16 detects the deviation amount of the wafer surface from an optimal focal point position using the position (optimal focal point position) of the best imaging plane of the projection optical system PL as the zero-point reference. Therefore, when a proper offset amount $x_3$ is electrically or optically given to the wafer position detection system (22a, 22b), a deviation of the focal point position caused by the driving operation of the lens element 69 and the lens elements (70, 71) can be corrected by aligning the wafer surface using the wafer position detection system (22a, 22b). At this time, formula (11) above is rewritten as:

$$\Delta F = C_{F1} \times x_1 + C_{F2} \times x_2 + x_3 \tag{14}$$

Similarly, the wafer surface detection system (22a, 22b) has a function of detecting the inclination amount of the wafer surface, and controlling the inclination of the wafer stage to make it coincide with the best imaging plane of the projection optical system PL. For this reason, when a proper offset $\theta_3$ is given to the inclination amount of the wafer surface in the same manner as the focal point position, the inclination of the image plane caused by the driving operation of the lens element 69 can be corrected by correcting the inclination of the wafer surface using the wafer surface detection system (22a, 22b). At this time, formula (13) is rewritten as:

$$\Delta L = C_{T2}\theta_1 + \theta_3 \tag{15}$$

Similarly, when the reticle R is translated in the optical axis direction, the distortion D and the focal point position F respectively change at a change rate corresponding to the moving amount of the reticle. If the driving amount of the reticle R is represented by $x_4$, the change amounts $\Delta D$ and $\Delta F$ of the distortion D and the focal point position F are respectively given by:

$$\Delta D = C_{D4} \times x_4 \tag{16}$$

$$\Delta F = C_{F1} \times x_1 + C_{F2} \times x_2 + x_3 + C_{F4} \times x_4 \tag{17}$$

where $C_{D4}$ and $C_{F4}$ are constants representing the change rates of the change amounts with respect to the driving amount of the reticle R.

As described above, when the driving amounts $x_1$ to $x_4$ are set in formulas (9), (10), (11), (15), and (17), the change amounts $\Delta M$, $\Delta C$, $\Delta T$, $\Delta D$, $\Delta F$, and $\Delta L$ can be arbitrarily corrected. In this embodiment, a case has been exemplified wherein six different imaging characteristic components are simultaneously corrected. Of the imaging characteristics of the projection optical system, if the change amount of a certain imaging characteristic component caused by thermal deformation of the reticle is negligible, the imaging characteristic component need not be corrected. When an imaging characteristic component other than the six imaging characteristic components described in this embodiment considerably changes, the imaging characteristic component must be corrected. In this embodiment, as the imaging characteristic correction mechanism, the arrangement for performing correction by moving the reticle R and the lens elements has been exemplified. However, the correction mechanism suited for this embodiment may adopt any other systems. For example, a space sandwiched between two lens elements may be sealed, and the pressure of a gas in the sealed space may be adjusted.

A correction method for a change in imaging characteristics caused by thermal deformation of the reticle will be briefly described below. Referring to FIG. 16, the main control system 20 acquires various kinds of optical information from the radiation amount monitor 16, the power monitor 5, the photoelectric conversion element 68, and the image pickup element 61, and acquires information associated with the shape and size of the aperture of the variable blind 10 from the driving motor 11. The main control system 20 calculates the thermal deformation amount of the reticle R, and the change amount of the imaging characteristics of the projection optical system PL itself, and outputs a control signal to the driving element control unit 23 or the wafer surface detection system 22. The main control system 20 stores various data (the type of the light-shielding member of the reticle, the density distribution of a pattern, and the like) required for calculating the thermal deformation amount of the reticle R. Also, the main control system 20 stores formulas, tables, or the like for calculating the change amount of the imaging state on the basis of the calculated thermal deformation amount.

When the light source 1 comprises a pulse light source such as an excimer laser source, and its power varies for every pulse emission, the power for each light pulse can be measured by the power monitor 5 at the same time. This information may be directly input from the bar code reader 78 or the console 77 to the main control system 20 in place of the direct measurement described above. As described above, the amount of heat absorbed by each block of the reticle R is obtained. Then, the amount of heat transfer between adjacent blocks is calculated. That is, the main control system 20 calculates a transfer process of heat from a high-temperature portion to a low-temperature portion.

On the reticle R, heat is not only transferred between blocks but also dissipated to the reticle table RT and the upper and lower spaces of the reticle R. The temperature of each block can be obtained by sequentially calculating these amounts of heat transfer. A digital computer normally adopts a method of obtaining a solution by repetitively performing calculations. At this time, in order to obtain temporal heat absorption information of the reticle R, calculations are performed by repetitively acquiring information from the shutter driving unit 3 or the power monitor 5 for every calculation. The thermal deformation amount of the reticle R can be calculated based on the temperatures of the blocks. Thus, the moving state of the points on the reticle R can be obtained.

Subsequently, a correction amount, which can minimize an error upon correction of the respective components of the change in magnification $\Delta M$, the trapezoidal distortion $\Delta T$, the distortion $\Delta D$, and the curvature of field $\Delta C$ by the above-mentioned correction mechanism, is calculated, and the correction is performed based on this correction amount. The correction amount is calculated by, e.g., a least square method, a method of minimizing a maximum point of an error, or the like.

Upon execution of the above-mentioned calculations of heat conduction, parameters representing heat transfer between the blocks of the reticle R, or the characteristics of heat dissipation to the reticle table RT and spaces around the reticle R must be calculated in advance. These parameters are numerals determined by the material of glass of the reticle R, the flow of the air around the reticle, and are obtained in advance by experiments or simulation calculations. These parameters are stored in an internal memory of the main control system 20.

The above description has been made about a case wherein no pellicles as anti-dust films are attached to the reticle R. However, even in reticles having the same pattern and consisting of the same material, the heat amount dissipated to the upper and lower spaces of the reticle R of the above-mentioned characteristics varies depending on the presence/absence of pellicles. In other words, even when the reticle is exposed with illumination light with the same energy, the temperature rise amount varies depending on the presence/absence of pellicles, and the change amount of the imaging characteristics caused by the thermal deformation of the reticle also varies.

Figure 19A:
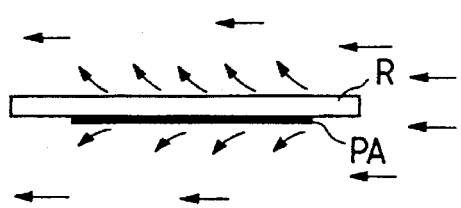
FIG. 19A is a view illustrating the dissipation state of heat accumulated on a reticle upon absorption of illumination light into the air.
Figure 19B:
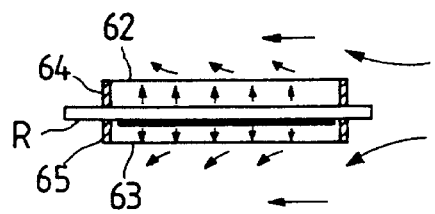
FIG. 19B is a view illustrating the dissipation state of heat accumulated on a reticle with pellicles upon absorption of illumination light into the air.

FIGS. 19A and 19B respectively illustrate a reticle without pellicles and a reticle with pellicles. The influence of the presence/absence of pellicles will be explained below with reference to FIGS. 19A and 19B. Normally, the projection exposure apparatus is a system which is accurately temperature-controlled, and in which clean air is always circulated. In particular, in order to prevent attachment of foreign matter, air is blown to the reticle, wafer, and the like from the lateral direction, as shown in FIGS. 19A and 19B. For this reason, in the case of the reticle without pellicles shown in FIG. 19A, heat is directly dissipated from the surfaces of the reticle R. However, in the case of the reticle with pellicles shown in FIG. 19B, heat is dissipated from only the surfaces of the pellicles 62 and 63. In addition, since the spaces between the pellicles 62 and 63 and the surfaces of the glass substrate of the reticle R are full of air with high heat insulation characteristics, the heat dissipation efficiency of this reticle is extremely smaller than that of the reticle which does not have the pellicles 62 and 63.

In other words, when the pellicles 62 and 63 are not attached, heat conduction occurs between the surfaces of the reticle and the air which flows at a temperature set by the apparatus. However, in the case of the reticle with pellicles, heat conduction occurs between the surfaces of the reticle and the air which is warm and does not flow. The heat conduction is normally proportional to the temperature difference between two objects, and if the flow rate of a gas as one of the two objects is high, heat conduction efficiently occurs. For this reason, the reticle R with pellicles shown in FIG. 19B has lower heat conduction efficiency than that of the reticle R without pellicles shown in FIG. 19A. The temperature rise of the reticle R is determined by a balance between the heat amount absorbed from exposure light and the heat amount dissipated to external portions. Therefore, in the case of the reticle with pellicles, since the heat amount to be dissipated is small, the temperature rise is balanced at a temperature higher than that of the reticle without pellicles. This means that the thermal deformation amount of the reticle R with pellicles is larger than of the reticle without pellicles.

According to experiments, it was confirmed that the thermal deformation amount of a reticle with pellicles was about 1.5 times to twice that of a reticle without pellicles. The presence/absence of pellicles is not common to all the reticles to be used in a single projection exposure apparatus. For example, in terms of cost and convenience, no pellicles are attached to a reticle with a coarse pattern, and pellicles are attached to a reticle with a fine pattern. For this reason, the presence/absence of pellicles must be informed to the main control system 20 by some means to change parameters used for calculating the thermal deformation amount of a reticle. In this embodiment, as shown in FIG. 16, the pellicle discriminators 79 and 80 each comprising, e.g., a non-contact photoelectric sensor, a contact type switch, or the like are arranged above and below the reticle R, and the pellicle presence/absence information signals detected by the pellicle discriminators 79 and 80 are supplied to the main control system 20.

The presence/absence information of pellicles on the reticle R may be input by an operator to the main control system 20 via the console 77. The pellicles 62 and 63 in FIG. 16 are attached to the upper and lower surfaces of the reticle R. However, when the glass substrate of the reticle R has a sufficient thickness, a pellicle is attached to only the lower surface (pattern formation surface) of the reticle R. For this reason, it is preferable that the pellicle discriminators 79 and 80 be arranged above and below the upper and lower surfaces of the reticle R to detect not only the presence/absence of pellicles but also the number of pellicles. In addition, in some cases, only the pellicle frames 64 and 65 are adhered to the reticle R, and the pellicles 62 and 63 are not attached. Thus, the pellicle discriminators 79 and 80 may discriminate the presence/absence of the pellicles 62 and 63 themselves.

Some projection exposure apparatuses are equipped with a foreign matter inspection device for inspecting the attachment state of foreign matter such as dust to the reticle R, and some other apparatuses can also inspect the attachment state of foreign matter to pellicles attached to the reticle R. In such a foreign matter inspection device, since the presence/absence of pellicles can be automatically detected or the presence/absence of pellicles is input by an operator by some method, the main control system 20 may receive pellicle presence/absence information from the foreign matter inspection device. A difference in characteristics depending on the presence/absence of pellicles can be detected in advance by, e.g., experiments, and the detection results can be stored in the main control system 20.

Figure 20:
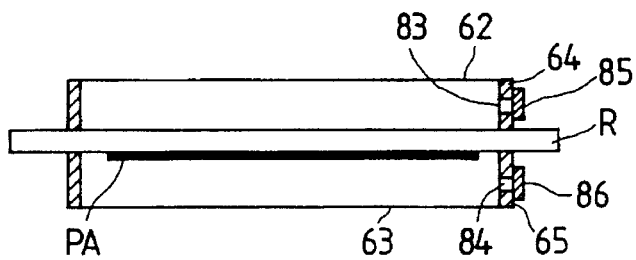
FIG. 20 is a sectional view showing the arrangement obtained when a ventilation hole is formed in each pellicle frame of a reticle with pellicles.

In some pellicles, as shown in FIG. 20, ventilation holes 83 and 84 are respectively formed in portions of the pellicle frames 64 and 65, and filter members 85 and 86 are provided to these holes to prevent entrance of foreign matter from these holes. These ventilation holes 83 and 84 are formed to prevent the pellicles 62 and 63 from swelling inwardly or outwardly due to a change in atmospheric pressure around the pellicles 62 and 63. Heat may be transferred even slightly from the ventilation holes 83 and 84 depending on the sizes of the ventilation holes 83 and 84, resistances upon passage of air through the filter members 85 and 86, and the like. Thus, information associated with these ventilation holes 83 and 84 and the filter members 85 and 86 can be input to the main control system 20, as needed. As described above, the thermal deformation of the reticle can be satisfactorily corrected even if a difference in heat conduction characteristics due to the presence/absence of pellicles is present.

Figure 21:
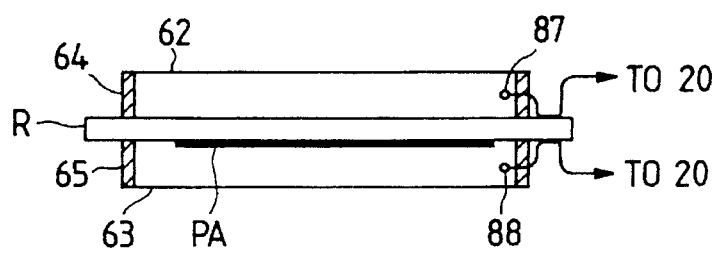
FIG. 21 is a sectional view showing the arrangement when the temperature of the air in the pellicles of a reticle with pellicles is to be measured.

In the above description, a method of performing correction based on indirect pellicle presence/absence information has been exemplified. Alternatively, a method of directly measuring the temperatures in the pellicles may be adopted. FIG. 21 shows a case wherein the temperatures in the pellicles 62 and 63 are directly measured. Referring to FIG. 21, temperature sensors 87 and 88 are respectively inserted in the pellicles 62 and 63 via through holes formed in the pellicle frames 64 and 65. Temperature information signals near the upper and lower surfaces of the reticle R, which are actually measured by these temperature sensors 87 and 88, are supplied to the main control system 20.

On the other hand, when no pellicles are attached, if the temperatures of the upper and lower surfaces of the reticle R are measured, such temperature measurement is nonsense since air which is temperature-controlled to a predetermined temperature, and air warmed by the reticle R are mixed with each other, and the temperature fluctuates. In contrast to this, the interior of the pellicle is a sealed space, and has an almost uniform temperature by, e.g., convection. Thus, temperature measurement is significant. As described above, since heat conduction between the glass substrate of the reticle R and air in the pellicle is proportional to a temperature difference therebetween, when the temperature in the pellicle is measured, the heat conduction amount can be estimated, and calculations in the main control system 20 can be performed more accurately. When only isotropic distortions, such as a change in magnification, distortion, and the like are taken into consideration regardless of anisotropic deformations (e.g., a trapezoidal distortion) in the reticle R, the temperature of air in the pellicle may be directly related to the change amount of the imaging characteristics of an image to be projected onto the wafer. With this method, complicated calculations need not be performed in the main control system 20.

In the above description, the temperatures in the pellicles 62 and 63 have been discussed. Since the pellicle frames 64 and 65 are directly adhered to the glass surfaces of the reticle R, if the adhesion force is high, expansion/contraction of the pellicle frames 64 and 65 may directly influence that of the reticle R itself. For this reason, an adhesive used for adhesion or an adhesion method (the pressure, temperature, and the like upon adhesion) is also input to the main control system 20 as information to discriminate if expansion/contraction of the pellicle frames 64 and 65 influences that of the reticle. When expansion/contraction of the pellicle frames 64 and 65 influences that of the reticle, since the pellicle frames have different expansion coefficients depending on their materials, the material or expansion coefficient of the pellicle frames 64 and 65 must be input. Normally, since the pellicle frames 64 and 65 consist of a metal, the thermal expansion coefficient of the pellicle frames 64 and 65 is larger than that of the glass substrate of the reticle R, and the expansion amount of the reticle R may increase in correspondence with that of the pellicle frames 64 and 65. Although the pellicles 62 and 63 normally consist of a material having high transmittance, the pellicles 62 and 63 themselves may absorb exposure light, and may heat air layers between the pellicles 62 and 63, and the reticle R. Thus, the material, transmittance, thickness, or the like of the pellicles 62 and 63 may be input as pellicle information to the main control system 20 as needed, and the thermal deformation amount of the reticle R may be calculated using this pellicle information.

Of course, since the material, thickness, and the like of the glass substrate of the reticle R influence thermal expansion, these pieces of glass substrate information must be input to the main control system 20, and must be used. Normally, as the glass substrate of the reticle R, quartz glass having high light transmittance, and a low thermal expansion coefficient is used. However, in terms of cost, and the like, other materials may be used. In other words, an apparatus which has a correction function of a change in imaging characteristics caused by the thermal deformation amount of the reticle R can use inexpensive glass as the glass substrate of the reticle R. When the glass substrate of the reticle R is thick, the heat capacity increases, the time constant of heat conduction also increases, and the thermal expansion amount of the reticle R decreases with respect to identical energy of illumination light. For this reason, information associated with the thickness of the glass substrate of the reticle R is effective information upon calculation of the thermal deformation amount of the reticle R.

In this embodiment, correction is performed based on the internal calculation results of the main control system 20 shown in FIG. 16. Alternatively, for example, the positions of alignment marks formed on the reticle R may be actually observed by the image pickup element 61 of the reticle alignment microscope 60, the thermal deformation amount of the reticle R may be actually measured on the basis of changes in position of the reticle marks, and correction may be performed based on the measurement result. In this case as well, since the thermal deformation amount inside the reticle R is unknown, such an actual measurement and internal calculations of the main control system 20 may be combined. In order to observe the alignment marks on the reticle R, the alignment marks must be illuminated by an illumination system of the reticle alignment microscope 60, as shown in FIG. 16, and the photoresist layer on the wafer W may be exposed by this illumination light. For this reason, the thermal deformation amount of the reticle R cannot be actually measured during the exposure operation. Thus, a method of measuring the thermal deformation amount of the reticle R every time the wafer is exchanged from one to another, and interpolating the measured data during the exposure operation may be used.

When a projection exposure apparatus using reticles with pellicles and a projection exposure apparatus which does not use any reticles with pellicles are clearly separately used, each of these projection exposure apparatuses can calculate the thermal deformation amount of each reticle using a corresponding set of fixed parameters. When the control error falls within an allowable range even using the thermal deformation amount of a reticle, which is calculated using intermediate parameters of those for the above-mentioned apparatuses, each of these two different projection exposure apparatuses may calculate the thermal deformation amount of each reticle using the intermediate parameters.

In the above-mentioned embodiment, the pellicles as anti-dust films are used to prevent attachment of foreign matter to the reticle R. When a cover glass is used in place of a pellicle, information associated with the presence/absence of the cover glass, and the like can be input to the main control system 20, and the main control system can calculate the thermal deformation amount of the reticle R based on this information.

According to this embodiment, shape data (information associated with the presence/absence of anti-dust films) of the reticle R is input, the thermal deformation amount of a mask, i.e., the change amount of the imaging state is calculated based on the input shape data, and the imaging state is corrected to cancel the calculated change amount of the imaging state. For this reason, a pattern on the reticle R can always be projected and exposed onto a photosensitive substrate in a predetermined imaging state independently of the presence/absence of pellicles or the like.

When the shape data includes data indicating the presence/absence of protective members for preventing attachment of foreign matter to the pattern formation surface of the reticle R, and data indicating the thickness of the reticle R, the thermal deformation amount of the reticle R can be accurately calculated.

When the temperature sensors for measuring the temperatures in the protective members of the reticle R are provided, and the main control system 20 calculates the change amount of the predetermined imaging state caused in correspondence with the thermal deformation amount of the reticle R, on the basis of the temperature information acquired upon measurement by these temperature sensors 87 and 88, and shape data input from the console 77, the thermal deformation amount of the reticle R can be calculated more accurately.

The present invention is not limited to the above embodiments, and various other arrangements may be adopted without departing from the scope of the invention.

What is claimed is:

1. A projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a temperature measurement sensor that measures a change in temperature of the mask;

a control system that calculates a change amount of the imaging state based on an output of said sensor; and a correction system that corrects the change in imaging state.

2. An apparatus according to claim 1, wherein said temperature measurement sensor optically measures the change in temperature of the mask.

3. An apparatus according to claim 2, wherein said temperature measurement sensor comprises a beam splitter arranged in said illumination optical system, a photoelectric sensor for receiving infrared rays generated from the mask via said beam splitter, and a temperature data processing system for calculating the change in temperature of the mask on the basis of information from said photoelectric sensor.

4. An apparatus according to claim 1, wherein said correction system corrects at least one of a change in magnification and a change in distortion.

5. An apparatus according to claim 4, wherein said correction system comprises a magnification correction system for correcting the change in magnification by moving at least one optical element in said projection optical system.

6. An apparatus according to claim 4, wherein said correction system comprises a magnification correction system for correcting the change in magnification by changing a pressure in a space sealed between two adjacent optical elements in said projection optical system.

7. An apparatus according to claim 4, wherein said correction system comprises a distortion correction system for correcting the change in distortion by moving the mask along an optical axis of said projection optical system.

8. An apparatus according to claim 4, wherein said correction system comprises a magnification correction system for correcting the change in magnification by moving at least one optical element in said projection optical system or by changing a pressure in a space sealed between two adjacent optical elements in said projection optical system, and a distortion correction system for correcting the change in distortion by moving the mask along an optical axis of said projection optical system.

9. A projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a deformation amount detection system for measuring or calculating a physical quantity corresponding to a deformation amount of the mask;

an imaging state calculation system for estimating a change amount of the imaging state caused by the deformation amount of the mask on the basis of a detection result of said deformation amount detection system;

a correction system for correcting the change in imaging state; and a control system for, when the change amount of the imaging state estimated by said imaging state calculation system is larger than an error amount, from a target imaging state, of an image state obtained when the imaging state is changed by operating said correction system, operating said correction system to change the imaging state so as to cancel the change amount of the imaging state estimated by said imaging state calculation system.

10. An apparatus according to claim 9, wherein when the change amount of the imaging state estimated by said imaging state calculation system is larger than the error amount, from the target imaging state, of the image state obtained when the imaging state is changed by operating said correction system, and an error amount of the change amount of the imaging state estimated by said imaging state calculation system, said control system operates said correction system to change the imaging state so as to cancel the change amount of the imaging state estimated by said imaging state calculation system.

11. A projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a deformation amount detection system for measuring or calculating a physical quantity corresponding to a deformation amount of the mask;

an imaging state calculation system for estimating a change amount of the imaging state on the photosensitive substrate caused by the deformation amount of the mask on the basis of a measurement or calculation result of said deformation amount detection system;

a correction system for changing the imaging state; and a control system for, when the change amount of the imaging state estimated by said imaging state calculation system is larger than an error amount of the change amount of the imaging state estimated by said imaging state calculation system, operating said correction system to change the imaging state so as to cancel the change amount of the imaging state estimated by said imaging state calculation system.

12. A projection exposure method for imaging an image of a pattern formed on a mask onto a photosensitive substrate in a predetermined imaging state using a projection exposure apparatus which comprises a light source for emitting illumination light, an illumination optical system for illuminating a mask, on which a predetermined pattern is formed, with the illumination light, and a projection optical system for forming an image of the pattern on the photosensitive substrate, comprising the steps of:

measuring or calculating a physical quantity corresponding to a deformation amount of the mask using a deformation amount detection system;

estimating, using an imaging state calculation means, a change amount of the imaging state caused by the deformation amount of the mask on the basis of a detection result of said deformation amount detection system;

correcting the change in imaging state using a correction system; and operating said correction system to change the imaging state so as to cancel the change amount of the imaging state estimated by said imaging state calculation system, when the change amount of the imaging state estimated by said imaging state calculation system is larger than an error amount, from a target imaging state, of an image state obtained when the imaging state is changed by operating said correction system.

13. A projection exposure method for imaging an image of a pattern formed on a mask onto a photosensitive substrate in a predetermined imaging state using a projection exposure apparatus which comprises a light source for emitting illumination light, an illumination optical system for illuminating a mask, on which a predetermined pattern is formed, with the illumination light, and a projection optical system for forming an image of the pattern on the photosensitive substrate, comprising the steps of:

measuring or calculating a physical quantity corresponding to a deformation amount of the mask using a deformation amount detection system;

estimating, using an imaging state calculation system, a change amount of the imaging state on the photosensitive substrate caused by the deformation amount of the mask on the basis of a detection result of said deformation amount detection system;

changing the imaging state using a correction system; and operating said correction system to change the imaging state so as to cancel the change amount of the imaging state estimated by said imaging state calculation system, when the change amount of the imaging state estimated by said imaging state calculation system is larger than an error amount of the change amount of the imaging state estimated by said imaging state calculation system.

14. An exposure method for transferring a pattern on a mask onto a photosensitive substrate by radiating illumination light in a predetermined wavelength range onto a pattern area of the mask held in a predetermined reference plane, comprising the steps of:

calculating a thermal deformation amount of the pattern area when the pattern area thermally deforms upon absorption of the illumination light while a position, in the reference plane, of a predetermined reference point in the pattern area is fixed;

determining movable ranges upon the thermal deformation, in the reference plane, of a plurality of predetermined points in the pattern area on the basis of the thermal deformation amount calculated in the calculating step, and calculating a maximum value of a deviation amount obtained when the pattern area thermally deformed by the amount calculated in the calculating step is deviated in a direction of the reference plane, so that the plurality of points in the pattern area thermally deformed by the amount calculated in the calculating step respectively exist in the movable ranges; and determining based on a value of the deviation amount if a position, in the reference plane, of the mask is detected.

15. A projection exposure apparatus, which comprises a light source for emitting illumination light, an illumination optical system for illuminating a mask, on which a predetermined pattern is formed, with the illumination light, and a projection optical system for forming an image of the pattern on a photosensitive substrate, and images the image of the pattern on the photosensitive substrate in a predetermined imaging state, comprising:

a data input system for inputting shape data representing a shape of the mask;

a calculation system for calculating a change amount of the predetermined imaging state caused in correspondence with a deformation amount of the mask on the basis of the shape data input from said data input system; and a correction system for correcting the imaging state so as to cancel the change amount calculated by said calculation system.

16. An apparatus according to claim 15, wherein the shape data includes data indicating a presence/absence of a protective member for preventing attachment of foreign matter to a pattern formation surface of the mask, a thickness of the mask, and a material of said mask.

17. An apparatus according to claim 15, further comprising: a temperature measurement sensor for, when a protective member for preventing attachment of foreign matter to a pattern formation surface is attached to the mask, measuring a temperature in the protective member, and wherein said calculation system calculates the change amount of the predetermined imaging state caused in correspondence with the deformation amount of the mask on the basis of temperature information measured by said temperature measurement sensor, and the shape data input from said data input system.

18. An exposure method for transferring a pattern on a mask onto a photosensitive substrate by irradiating a pattern area of the mask, held substantially at a predetermined position, with illumination light of a predetermined wavelength region, comprising:

obtaining information related to deformation of said mask caused by absorption of illumination light; and determining whether a position of said mask is to be measured or not based on the information related to deformation of said mask.

19. An exposure method according to claim 18, wherein in said determining, it is determined that the position of the mask is to be measured, when a positional deviation amount of said mask from said predetermined position exceeds a predetermined threshold value.

20. An exposure method according to claim 19, further comprising correcting the position of said mask, wherein the correcting of the position of said mask is performed after deformation of said mask and measurement of the position of the mask.

21. An exposure method according to claim 18, wherein said information related to deformation of said mask is obtained by a calculation or a measurement.

22. An exposure method for transferring a pattern on a mask onto a substrate through a projection optical system, comprising:

obtaining information related to said mask; and correcting an imaging state of said pattern based on the information related to said mask;

wherein said information comprises at least one of information on presence/absence of a protection member of said mask, information on a thickness of said mask and information on a material of said mask.

23. An exposure method according to claim 22, wherein said information comprises information on deformation of said mask.

24. An exposure method for transferring a pattern on a mask onto a substrate through a projection optical system, comprising:

obtaining information related to said mask; and performing a measurement of a position of said mask, a correction of the position of said mask and a correction of an imaging state of said pattern based on said information.

* * * * *